United States Patent
Lin et al.

(10) Patent No.: US 7,311,776 B2
(45) Date of Patent: Dec. 25, 2007

(54) LOCALIZED SYNTHESIS AND SELF-ASSEMBLY OF NANOSTRUCTURES

(75) Inventors: Liwei Lin, Castro Valley, CA (US); Ongi Englander, Berkeley, CA (US); Dane Christensen, Oakland, CA (US)

(73) Assignee: The Regents of the University of California, Oakland, CA (US)

( * ) Notice: Subject to any disclaimer, the term of this patent is extended or adjusted under 35 U.S.C. 154(b) by 331 days.

(21) Appl. No.: 11/027,749

(22) Filed: Dec. 29, 2004

(65) Prior Publication Data

US 2005/0253220 A1 Nov. 17, 2005

Related U.S. Application Data

(60) Provisional application No. 60/533,778, filed on Dec. 30, 2003.

(51) Int. Cl.
*C30B 19/12* (2006.01)
(52) U.S. Cl. .............................. 117/87; 117/88; 117/95
(58) Field of Classification Search ..................... None
See application file for complete search history.

(56) References Cited

U.S. PATENT DOCUMENTS

2002/0127170 A1*  9/2002  Hong et al. .............. 423/447.3
2003/0042128 A1   3/2003  Harutyunyan et al.
2005/0202185 A1*  9/2005  Greengard et al. ......... 427/585
2005/0253220 A1   11/2005 Lin et al.
2005/0287297 A1   12/2005 Birls et al.

* cited by examiner

Primary Examiner—Robert Kunemund
(74) Attorney, Agent, or Firm—John P. O'Banion

(57) ABSTRACT

Systems and methods for local synthesis of silicon nanowires and carbon nanotubes, as well as electric field assisted self-assembly of silicon nanowires and carbon nanotubes, are described. By employing localized heating in the growth of the nanowires or nanotubes, the structures can be synthesized on a device in a room temperature chamber without the device being subjected to overall heating. The method is localized and selective, and provides for a suspended microstructure to achieve the thermal requirement for vapor deposition synthesis, while the remainder of the chip or substrate remains at room temperature. Furthermore, by employing electric field assisted self-assembly techniques according to the present invention, it is not necessary to grow the nanotubes and nanowires and separately connect them to a device. Instead, the present invention provides for self-assembly of the nanotubes and nanowires on the devices themselves, thus providing for nano-to micro-integration.

13 Claims, 29 Drawing Sheets

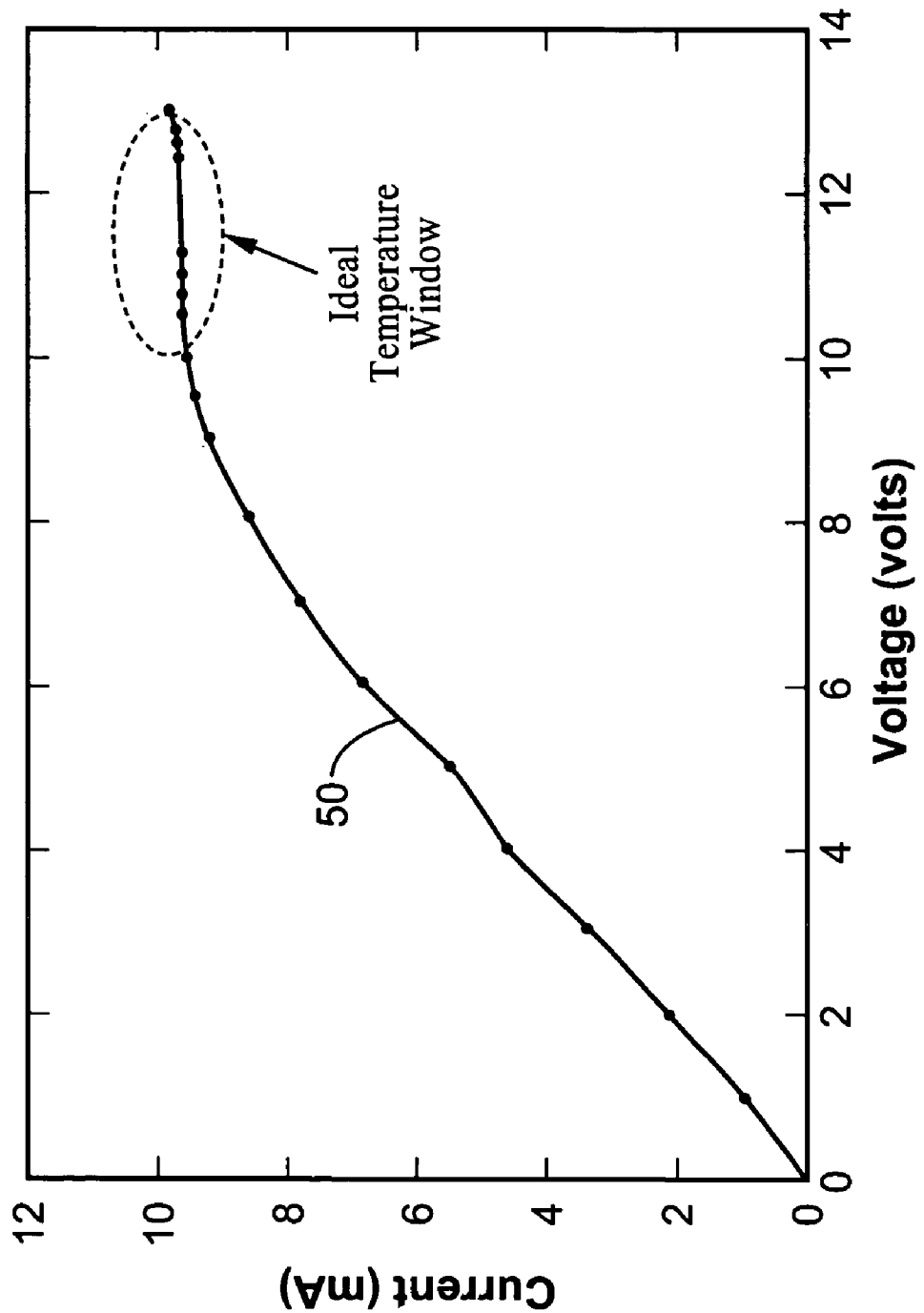

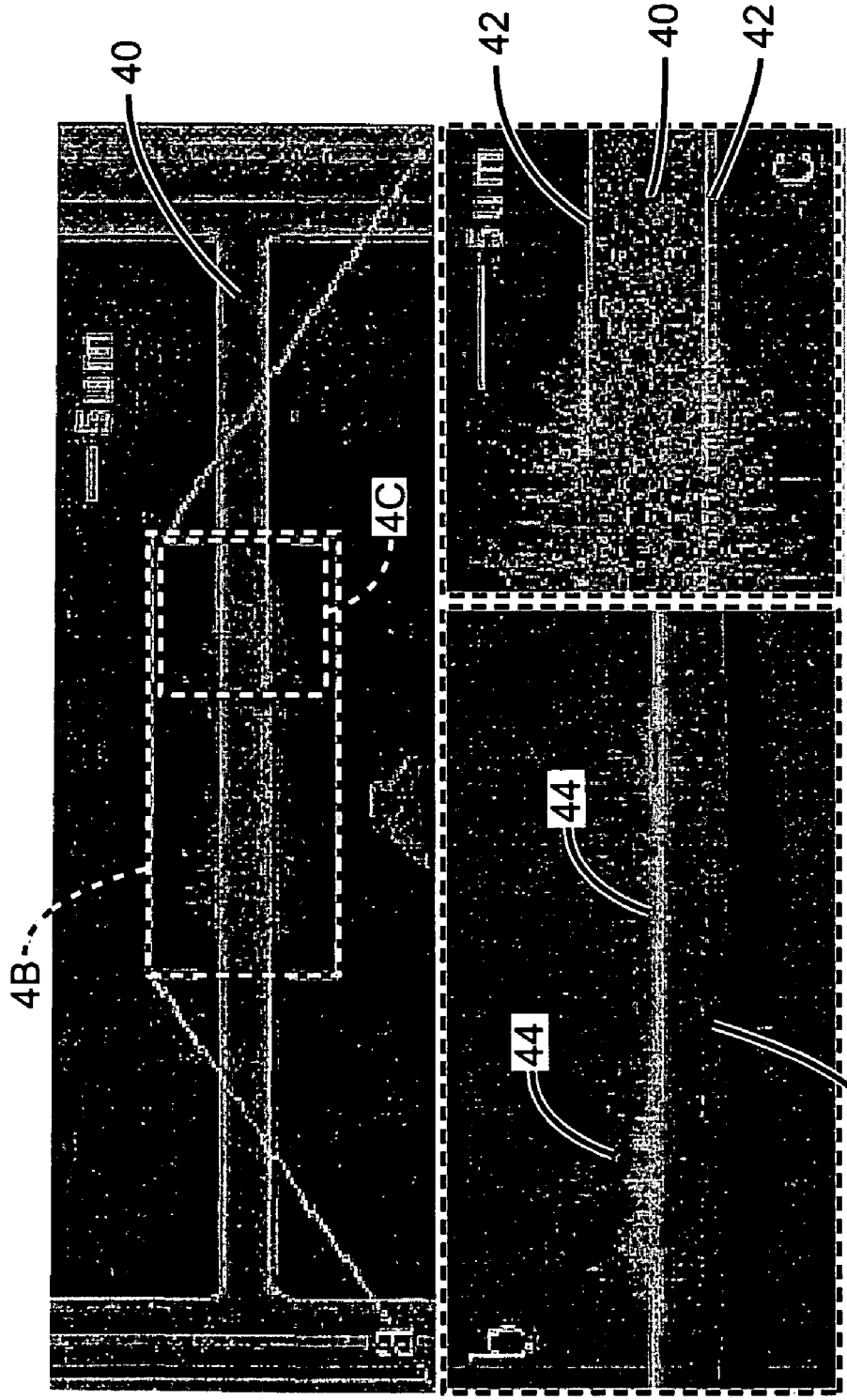

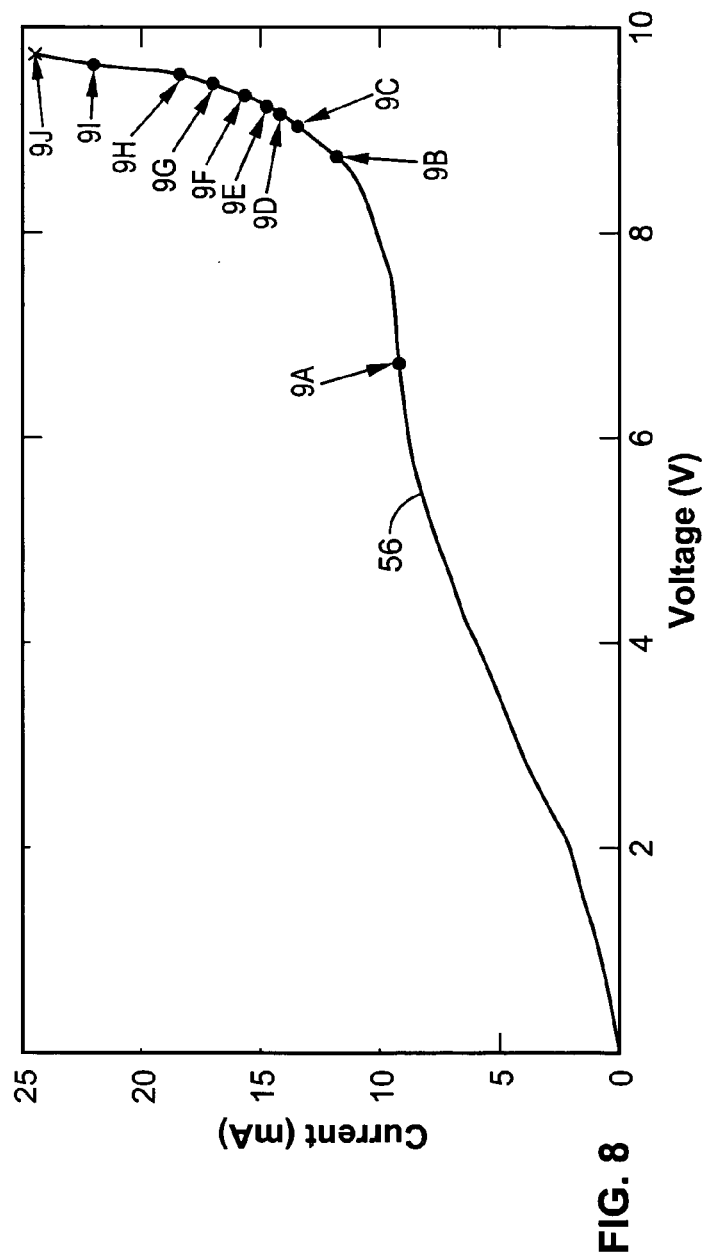
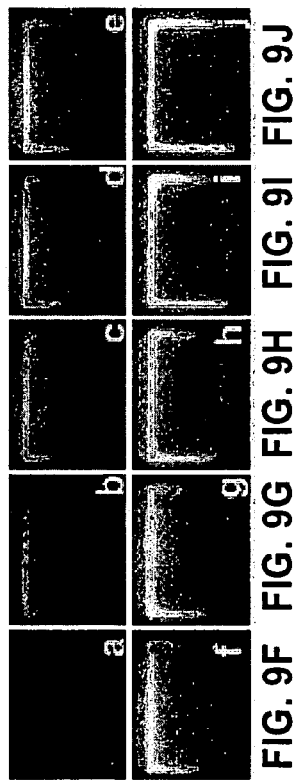
FIG. 8
FIG. 9A  FIG. 9B  FIG. 9C  FIG. 9D  FIG. 9E
FIG. 9F  FIG. 9G  FIG. 9H  FIG. 9I  FIG. 9J

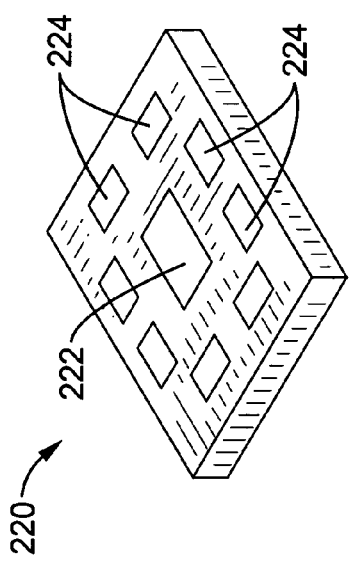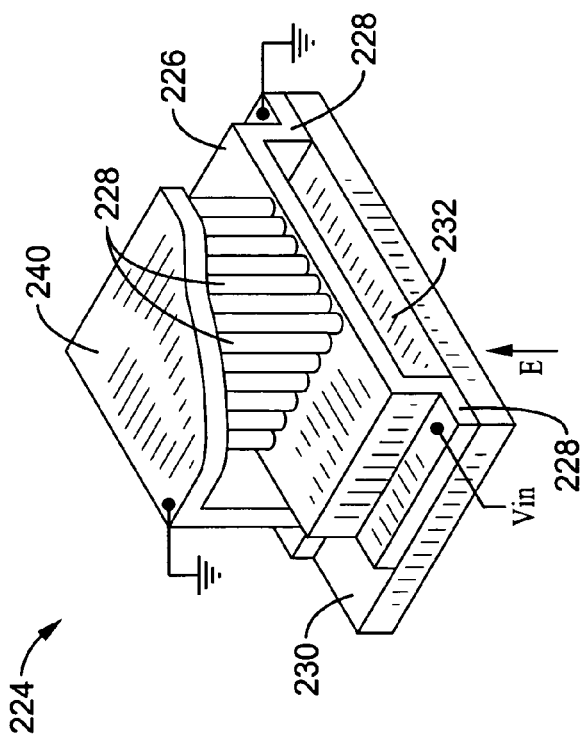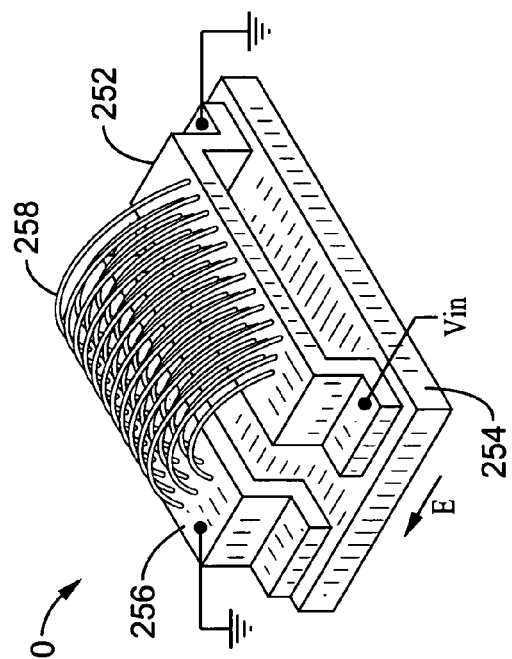

LOCALIZED SYNTHESIS AND SELF-ASSEMBLY OF NANOSTRUCTURES

CROSS-REFERENCE TO RELATED APPLICATIONS

This application claims priority from U.S. provisional application Ser. No. 60/533,778 filed on Dec. 30, 2003, incorporated herein by reference in its entirety.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to fabrication of nanostructures, and more particularly to a method and system for nano to micro integration through self-assembly.

2. Description of Related Art

The unique electrical, mechanical and optical properties of nanowires and nanotubes have made them extremely attractive for a variety of applications. However, a significant obstacle in the application of these nanostructures has been the difficulty in handling, maneuvering, and integrating them with microelectronics to form a complete system. Current synthesis processes for silicon nanowires and carbon nanotubes require high temperature furnaces that could damage pre-existing microelectronics. Therefore, there is a need for a method and system that provides for localized growth and self-assembly in a room temperature chamber.

BRIEF SUMMARY OF THE INVENTION

The present invention pertains to local synthesis of silicon nanowires and carbon nanotubes. The present invention also pertains to electric field assisted self-assembly of silicon nanowires and carbon nanotubes.

The approach of the present invention is based on localized resistive heating of suspended microstructures in a room temperature chamber to activate silicon nanowire or carbon nanotube synthesis via the vapor-liquid-solid (VLS) growth mechanism. By employing localized heating in the growth of the nanowires or nanotubes, the structures can be synthesized on a device in a room temperature chamber without the device being subjected to overall heating. The method is localized and selective, and provides for a suspended microstructure to achieve the thermal requirement for vapor deposition synthesis, while the remainder of the chip or substrate remains at room temperature. Accordingly, sensitive processed devices are not subjected to damaging heat during fabrication of the nanotubes and nanowires.

Furthermore, by employing electric field assisted self-assembly techniques according to the present invention, it is not necessary to grow the nanotubes and nanowires and separately connect them to a device. Instead, the present invention provides for self-assembly of nanostructures such as nanotubes and nanowires on the devices, such as integrated circuits, themselves, thus providing for nano- to micro-integration.

According to an aspect of the invention, a desired nanostructure is synthesized at a pre-specified location without the requirement of later assembly processes. This localized selective synthesis process is capable of direct integration of either silicon nanowires or carbon nanotubes with larger-scale systems, such as foundry-based microelectronics processes. In one embodiment, the process is carried out using resistive heating of suspended microstructures in a room temperature chamber to activate vapor-deposition synthesis and yield either silicon nanowires or carbon nanotubes.

By way of example, and not of limitation, in one embodiment of the invention a microscale conductive element is fabricated using standard bulk and surface micromachining techniques. An appropriate catalyst layer is then deposited atop the microstructure, with a thickness of several nanometers. A current is passed through the microstructure which causes it to resistively heat. By controlling the current and voltage applied to the microstructure, a hot spot can be controlled and accurately located in the microstructure. This hot spot then provides the energy necessary to instigate and sustain synthesis of the nanostructure of interest; The ambient environment during nanomaterial synthesis includes a room-temperature pressure-controlled vacuum chamber and room temperature, mass-flow-controlled precursor, active, and inert gasses. This allows for fabrication of integrated nanostructures in one localized region on or above a chip, while the bulk of the microchip remains at room temperature.

Therefore, another aspect of the invention is to integrate nanomaterials with standard microelectronics and/or MEMS devices. This direct integration is a key step for nanomaterial implementation, as it implicitly precludes time-consuming post-growth manipulation and expensive e-beam lithography. Such direct integration, or self-assembly, is facilitated by application of an electric field to the region of nanostructure synthesis. Nanostructure growth follows the direction of the electric field lines and, therefore, the direction of nanostructure growth can be controlled. The nanostructure is then synthesized from the growth structure as described above to a secondary structure which the nanostructure contacts and bonds thereto.

In another aspect of the present invention, a method for synthesizing a nanostructure in a room temperature environment comprises generating localized microresistive heating to initiate and sustain nanostructure growth.

In one mode of the current aspect, the method further includes subjecting said nanostructure to an electric field, and controlling the orientation of said electric field to control the direction of the nanostructure. In some embodiments, the electric field comprises a plurality of electric field lines, wherein growth of the nanostructure is oriented along the electric field lines.

In another mode of the current aspect, generating localized microresistive heating comprises passing current through a resistive element to provide localized heating to initiate and sustain nanostructure growth. Generally, a catalyst is deposed on the resistive element prior to heating. The catalyst facilitates a VLS (vapor-liquid-solid) synthesis process upon heating of the resistive element to generate nanostructure growth.

In many cases, the method further comprises subjecting the resistive element to a treatment gas under vacuum. In one variation, the resistive element is subjected to a silicon-based gas to promote growth of one or more silicon nanowires. Alternatively, the resistive element is subjected to a carbon-based gas to promote growth of one or more carbon nanotubes.

Another aspect of the invention is a method for synthesizing a nanostructure, comprising the steps of providing a resistive microstructure, passing a current through the microstructure to cause it to resistively heat in a room-temperature environment, and controlling the temperature of a location on the microstructure by controlling the current and voltage applied to the microstructure. The controlled location on the microstructure provides the energy necessary to instigate and sustain synthesis of the nanostructure of interest.

In one mode of the current aspect, providing a resistive microstructure comprises suspending a microstructure above a substrate, wherein the microstructure being insulated from the substrate. In many embodiments, suspending a microstructure comprises etching a microstructure from a multilayer wafer.

In another mode of the present aspect, the method further comprises coating the microstructure with a catalyst prior to heating the microstructure. The catalyst may comprise a thin layer having one or more of the following elements: nickel, iron, titanium, zinc, tin, gold, and palladium.

To facilitate nanostructure growth, the microstructure may then be subjected to a treatment gas. The treatment gas may comprise a silicon or carbon-based gas such as one or more of the following: acetylene, silane, silicon tetrachloride, or methane. In many embodiments, the treatment gas is subjected to the microstructure under vacuum.

In another mode of the current aspect, applying an electric field to the region of nanostructure synthesis, wherein nanostructure growth follows the direction of the electric field lines.

In yet another mode of the current aspect, the method further comprises providing a secondary structure in proximity of the resistive microstructure, wherein the nanostructure is synthesized from the resistive microstructure to the secondary structure which the nanostructure contacts and bonds thereto.

Another aspect of the present invention is a method of integrating a nanostructure with a wafer comprising at least one microelectronic device. The method includes the steps of establishing a resistive microstructure on the wafer, wherein the resistive microstructure is thermally insulated from the microelectronic device, and supplying current to the resistive microstructure to generate localized heat at a location on the microstructure while maintaining the microelectronic device at room temperature. As a result, one or more nanostructures synthesized at the location on the microstructure as a result of the localized heat at the location.

In one mode of the current aspect, establishing the resistive microstructure includes etching a resistive microbridge into the wafer, and coating the microbridge with a catalyst layer. In many embodiments, a cavity may be etched under the microbridge to insulate the microbridge from the wafer.

In yet another aspect of the present invention, an apparatus is disclosed for generating synthesis of a nanostructure in a room temperature environment. The apparatus includes a resistive microstructure, wherein the microstructure is configured such that current may be passed through the microstructure to generate a localized heating at a location on the microstructure, the localized heating resulting in growth of one or more nanostructures.

In one mode of the current aspect, the resistive microstructure comprises one of the following: a polysilicon microstructure using a standard surface micromachining process; or a bulk-etched single crystal silicon microstructure based on a silicon-on-insulator (SOI) wafer.

In another mode of the current aspect, the resistive microstructure comprises a microbridge suspended over a substrate such that the microbridge is thermally and electrically insulated from the substrate. In addition, the apparatus may further comprise an insulating layer coupling the suspended microbridge and the substrate.

In many embodiments, the resistive microstructure further includes a catalyst layer disposed on the top surface of the microstructure. Typically, the catalyst layer comprises one or more of the following (or similar) metals: nickel, iron, titanium, zinc, tin, gold, and palladium. The catalyst is configured such that the heated microstructure may be subjected to a treatment gas, so that the treatment gas facilitating nanostructure synthesis. In some embodiments, the catalyst and treatment are configured to promote growth of one or more silicon nanowires. Alternatively, the catalyst and treatment gas are configured to promote growth of one or more carbon nanotubes.

In another mode of the current aspect, the apparatus includes a biasing microstructure disposed adjacent to the resistive microstructure, wherein the biasing microstructure is spaced apart from the resistive microstructure via a gap. Typically, the biasing structure is configured to generate an electric field, wherein the electric field controls the direction of the nanostructure growth. Additionally, the biasing structure may be configured such that the synthesized nanostructures span from the resistive microstructure to contact and terminate at the biasing microstructure. In such a case, the biasing structure and resistive microstructure may be configured to operate as a two-terminal nanodevice.

In one embodiment, the biasing structure may be configured to function as an actuator to move and actuate the nanostructures.

In yet another aspect of the present invention, an integrated circuit is disclosed having at least one microelectronic device and one or more nanostructures disposed on a wafer. The integrated circuit includes a resistive microstructure disposed on the wafer, wherein the resistive microstructure is thermally insulated from the microelectronic device. The resistive microstructure is configured to generate localized heat at a location on the microstructure while maintaining the microelectronic device at room temperature, such that the localized heat results in synthesis of the one or more nanostructures at the location on the microstructure.

In one mode of the current aspect, the resistive microstructure comprises a resistive microbridge etched into the wafer. The microbridge has a catalyst layer disposed on its surface, wherein the catalyst layer facilitates nanostructure growth at the location upon subjecting the heated microstructure to a treatment gas. The wafer may further include a cavity under the microbridge to insulate the microbridge from the wafer.

In a further aspect of the present invention, an apparatus for generating synthesis of a nanostructure in a room temperature environment includes means for delivering localized heat to a location on a microstructure, wherein said means is responsive to a catalyst and treatment gas such that one or more nanostructures are synthesized on the microstructure. The apparatus may further comprise means for thermally isolating the microstructure such that the ambient temperature is not increase as a result of the localized heat at the microstructure.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 1 is schematic diagram of a growth chamber for nanostructure fabrication according to the present invention.

FIG. 2A through FIG. 2G is a series of diagrams illustrating a silicon-on-insulator (SOI) microstructure fabrication process flow and setup for nanostructure synthesis according to the present invention, where FIG. 2A illustrates an initial 3-layer wafer, FIG. 2B illustrates microstructure layer patterning and etching, FIG. 2C illustrates timed wet etch of the sacrificial oxide layer, FIG. 2D illustrates maskless catalyst evaporation, FIG. 2E illustrates wirebond and electrical actuation in the desired gaseous ambient, FIG. 2F illustrates resulting nanostructures, and FIG. 2G illustrates a front view of the catalyst evaporation process of FIG. 2E.

FIG. 3 is an experimental current-voltage (I-V) curve for a representative U-shaped MEMS microbridge employed in the present invention, illustrating the optimal temperature region (optimal growth region) falling outside of the linear region of the curve.

FIG. 4A through FIG. 4C are SEM images illustrating localized silicon nanowire growth on a suspended polysilicon microbridge according to the present invention, where FIG. 4A illustrates silicon nanowire growth spanning approximately 35 μm at the center of a 100 μm long by 5 μm wide polysilicon microbridge, FIG. 4B is a close-up oblique view of the nanowire growth region, showing the shorter nanowire region at the center of the structure where the rate of heat dissipation increased due to downward self-buckling of the structure, and FIG. 4C is a top view illustrating the nanowire growth/non-growth interface depicting the location where the temperature was not sufficiently high to initiate nanowire growth and temperature sensitivity of the synthesis mechanism.

FIGS. 5A-B are SEM images illustrating nanowire growth located to the central region of a polysilicon U-shaped MEMS structure employed in the present invention, wherein the wires are seen to cross over a 5 μm gap and rest on an adjacent MEMS structure, and where FIG. 5A illustrates a full actuated structure shown with a parallel bridge above, and FIG. 5B is a close-up of the nanowire growth region.

FIG. 6 is an SEM image illustrating nanowire growth on a single crystal silicon MEMS U-shaped structure.

FIG. 7 is a graph illustrating a thermoelectric model for the microbridge shown in FIG. 4, and depicting the distribution of the temperature along the surface of the microbridge. Nanowire growth is shown as taking place between 600° C. and 700° C., and depicting the optimal growth region along an approximately 35 μm center section of the microbridge.

FIG. 8 illustrates the current-voltage (I-V) relationship for a U-shaped microbridge for nanotube synthesis according to the present invention.

FIG. 9A through FIG. 9J are microphotos of a 150 μm long microstructure during activation, which correspond to points on the graph shown in FIG. 8.

Figures 12A, 12B:
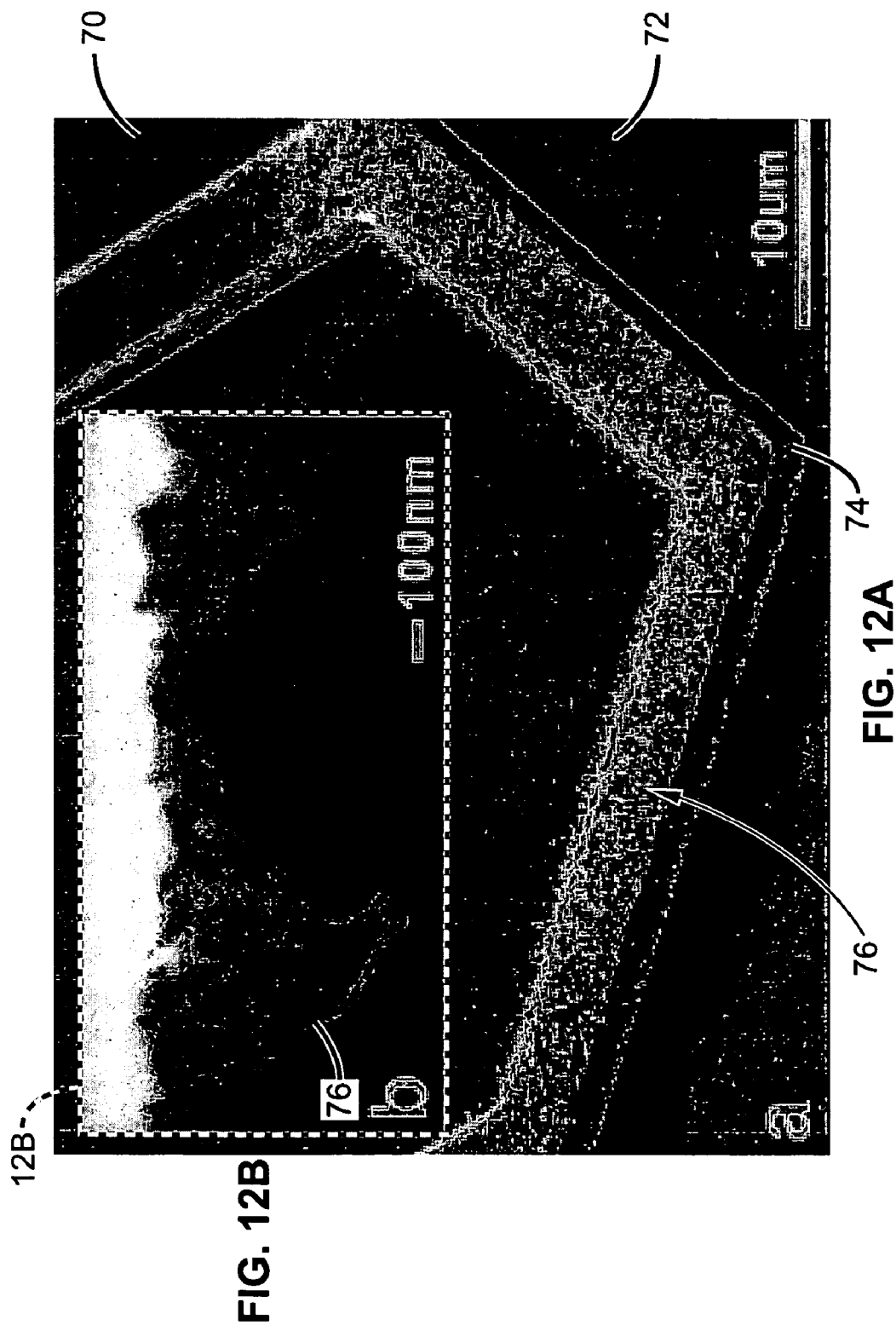

FIG. 12A and FIG. 12B are SEM images showing nanotube synthesis according to the present invention, where FIG. 12A shows 0.5 μm to 2 μm long and 15 nm in diameter CNTs localized to the center of a "pointed" microstructure after 10-minute growth, and FIG. 12B is a high resolution SEM image of CNT growth near the center of the microstructure.

Figure 13A:
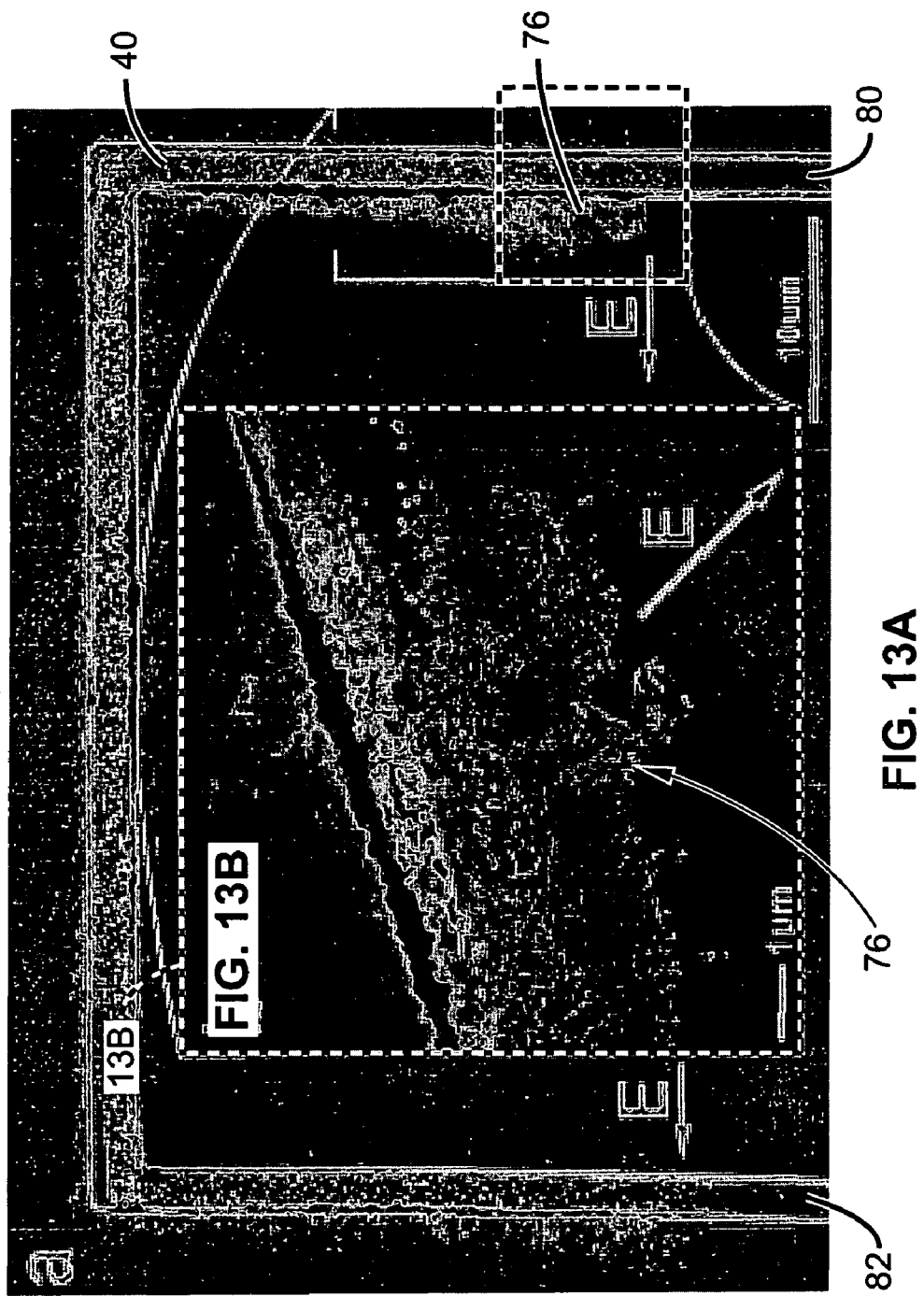

FIG. 13A and FIG. 13B are SEM images showing nanotube synthesis according to the present invention, where FIG. 13A illustrates synthesis localized to microstructure "legs" and growth occurring largely in the direction of the local E-field, and FIG. 13B is a high resolution SEM image of the right leg section (oblique view) showing the CNTs curving to follow the local E-field.

Figure 14:
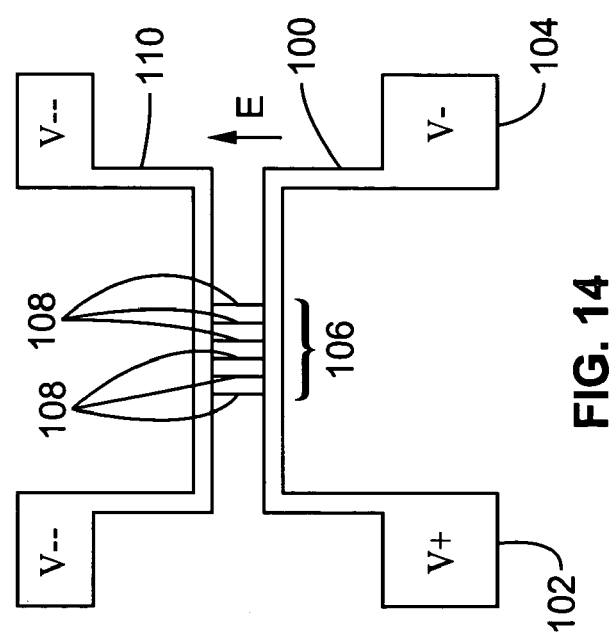

FIG. 14 is a schematic diagram of an embodiment of a system for localized synthesis and self-assembly of nanowires/nanotubes according to the present invention.

Figure 15:
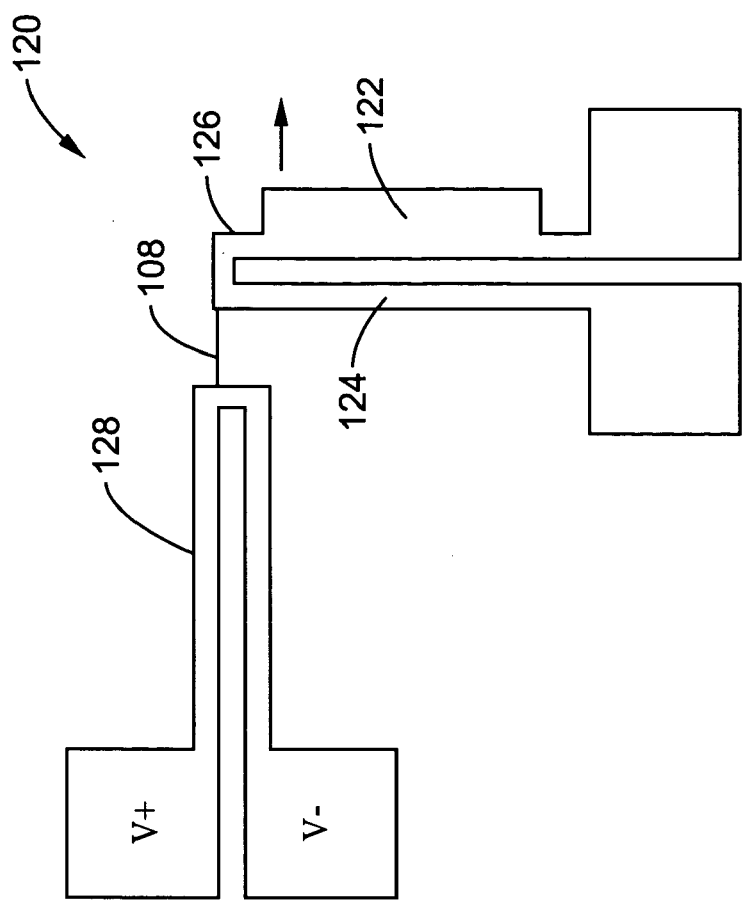

FIG. 15 is a schematic diagram of an embodiment of a heactuator MEMS structure for localized synthesis and self-assembly of nanowires/nanotubes according to the present invention that functions an actuator to move and actuate nanostructures.

Figure 16:
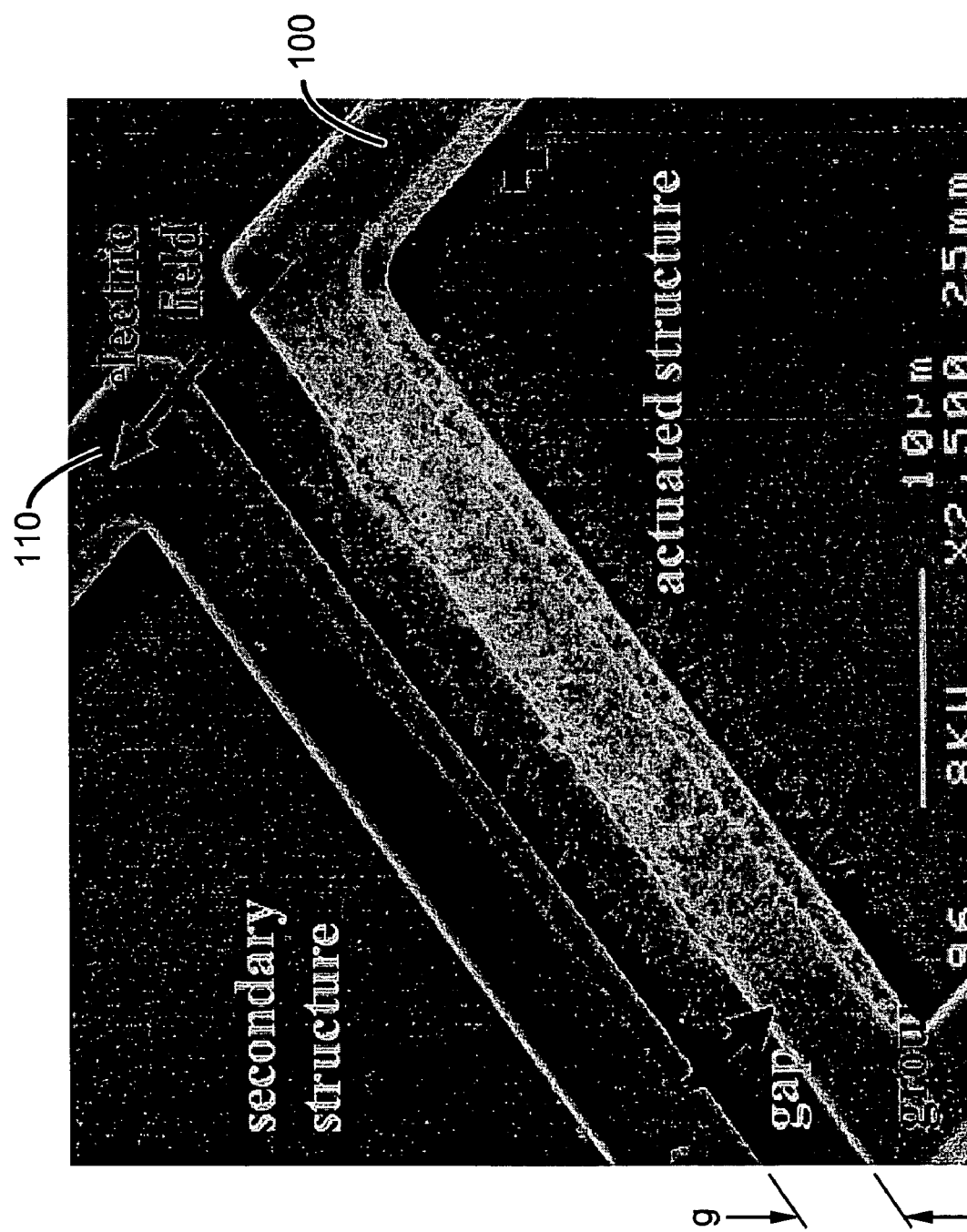

FIG. 16 is a SEM image of silicon nanowires bridging a gap between parallel bridges of the configuration shown in FIG. 14.

Figures 17A, 17B:
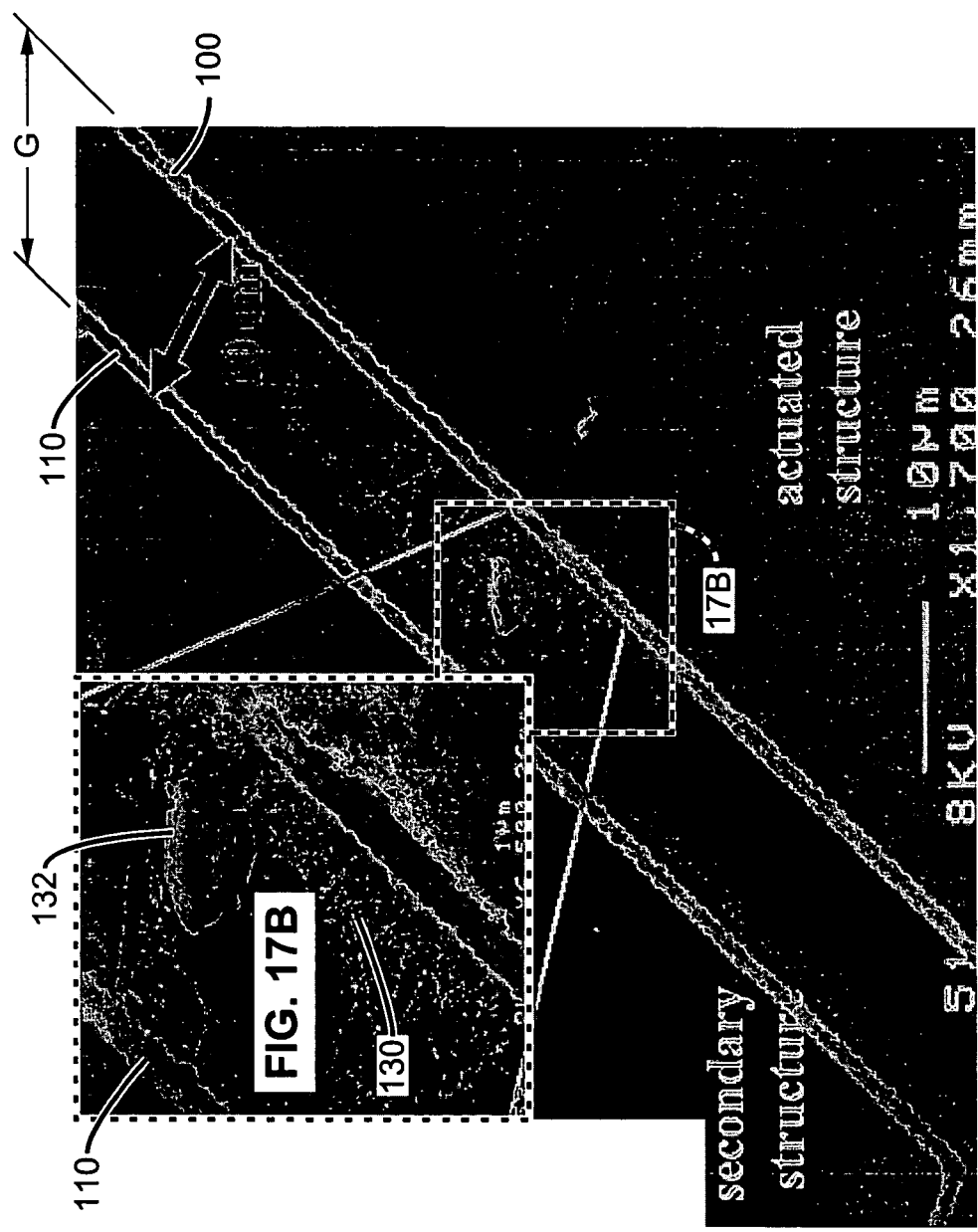

FIG. 17A and FIG. 17B are SEM images of silicon nanowires bridging a 10 μm gap between parallel structures, wherein the strength of the bond to the secondary structure is evidenced by the nanowires supporting a large piece of silicon debris.

Figure 18:
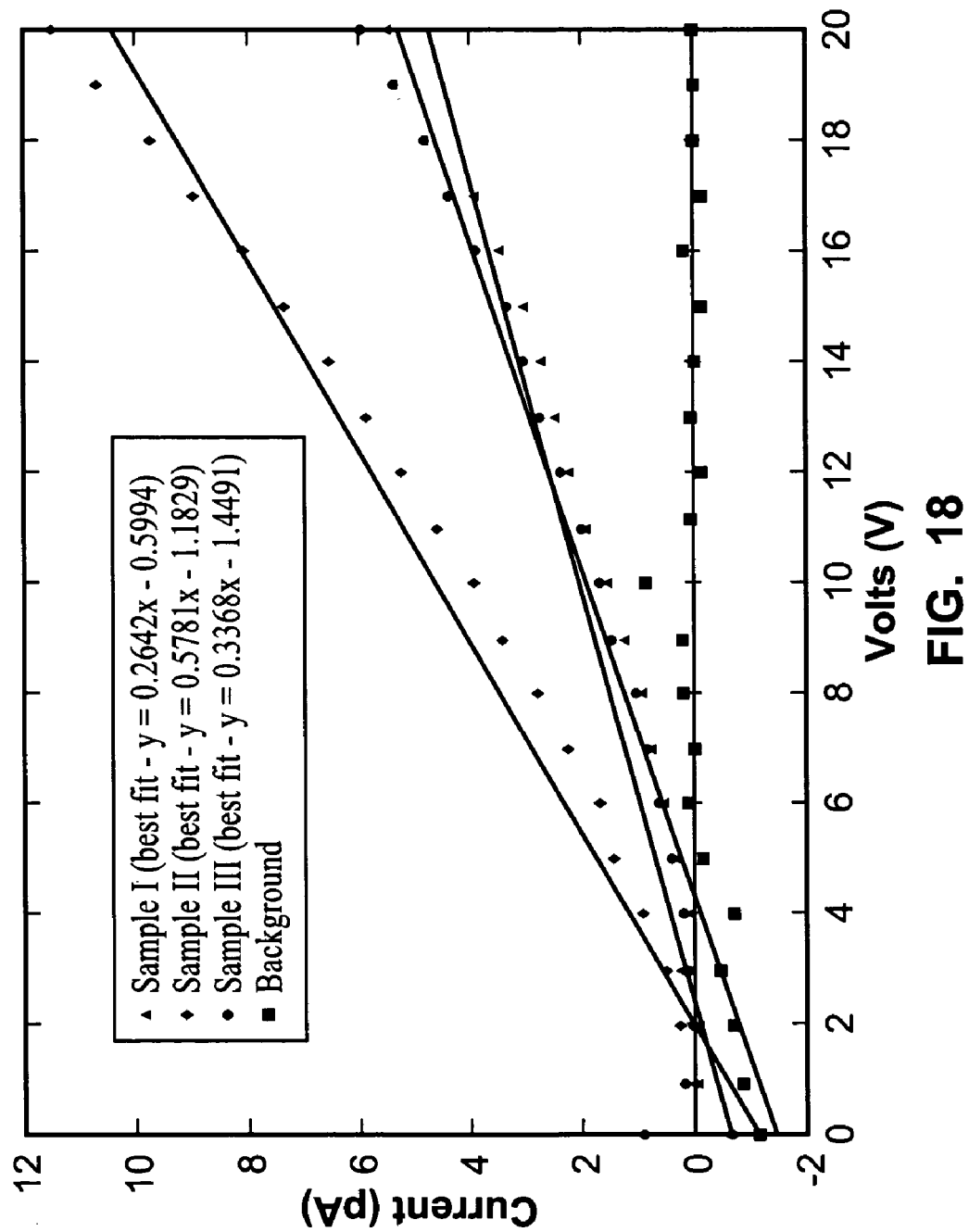

FIG. 18 is a graph illustrating the current-voltage relationships for a plurality of representative samples of self-assembled silicon nanowires as shown in FIG. 14 compared to the background noise, where the slopes of the curves correspond to the high resistance values which are expected for intrinsic silicon nanowires.

Figures 19A, 19B, 19C:
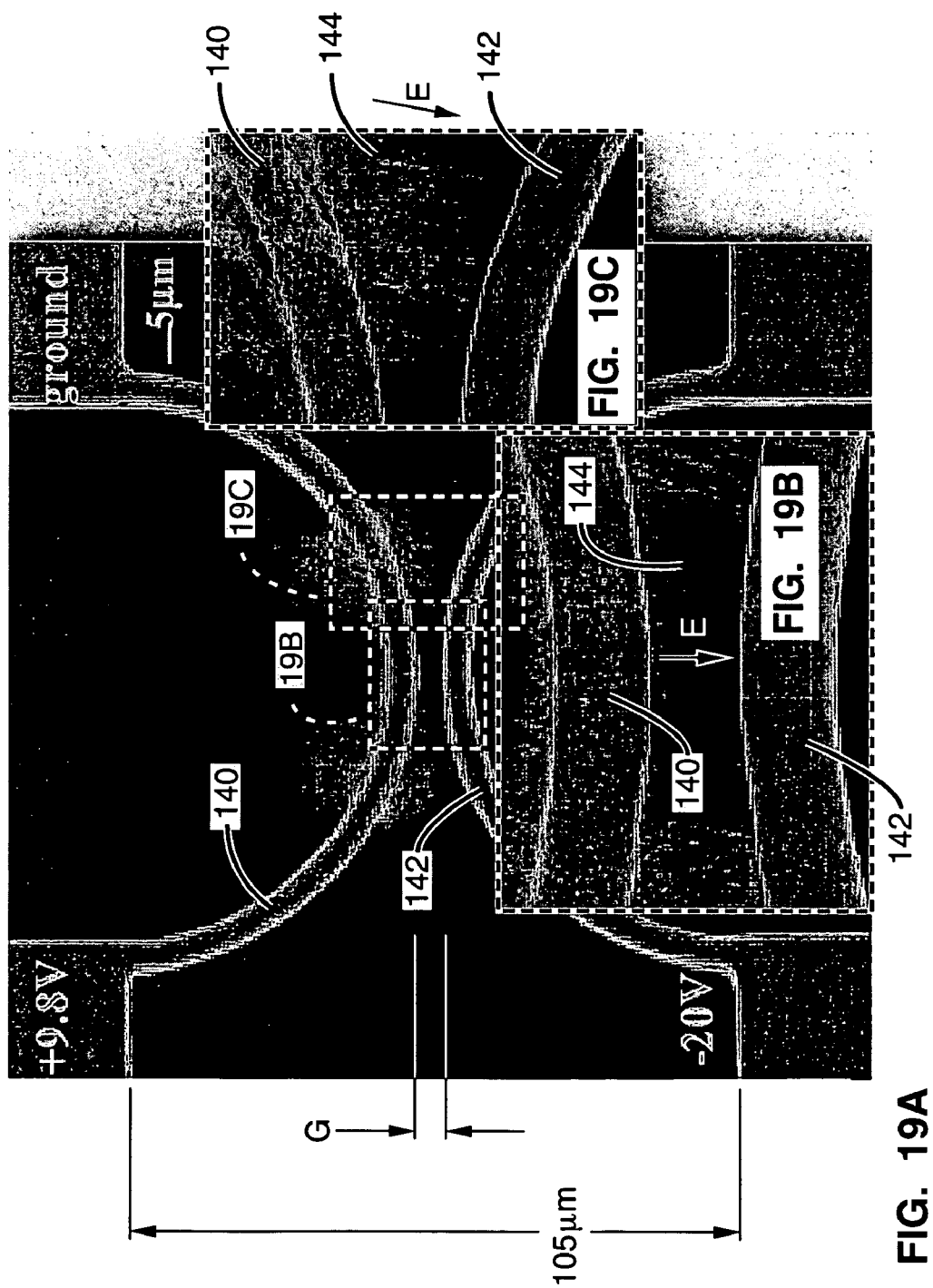

FIG. 19A through FIG. 19C are SEM image of silicon nanowires linking two semi-circular bridges according to the present invention and illustrating the nanowires orienting themselves during growth with the orientation of the applied electric field.

Figure 20:
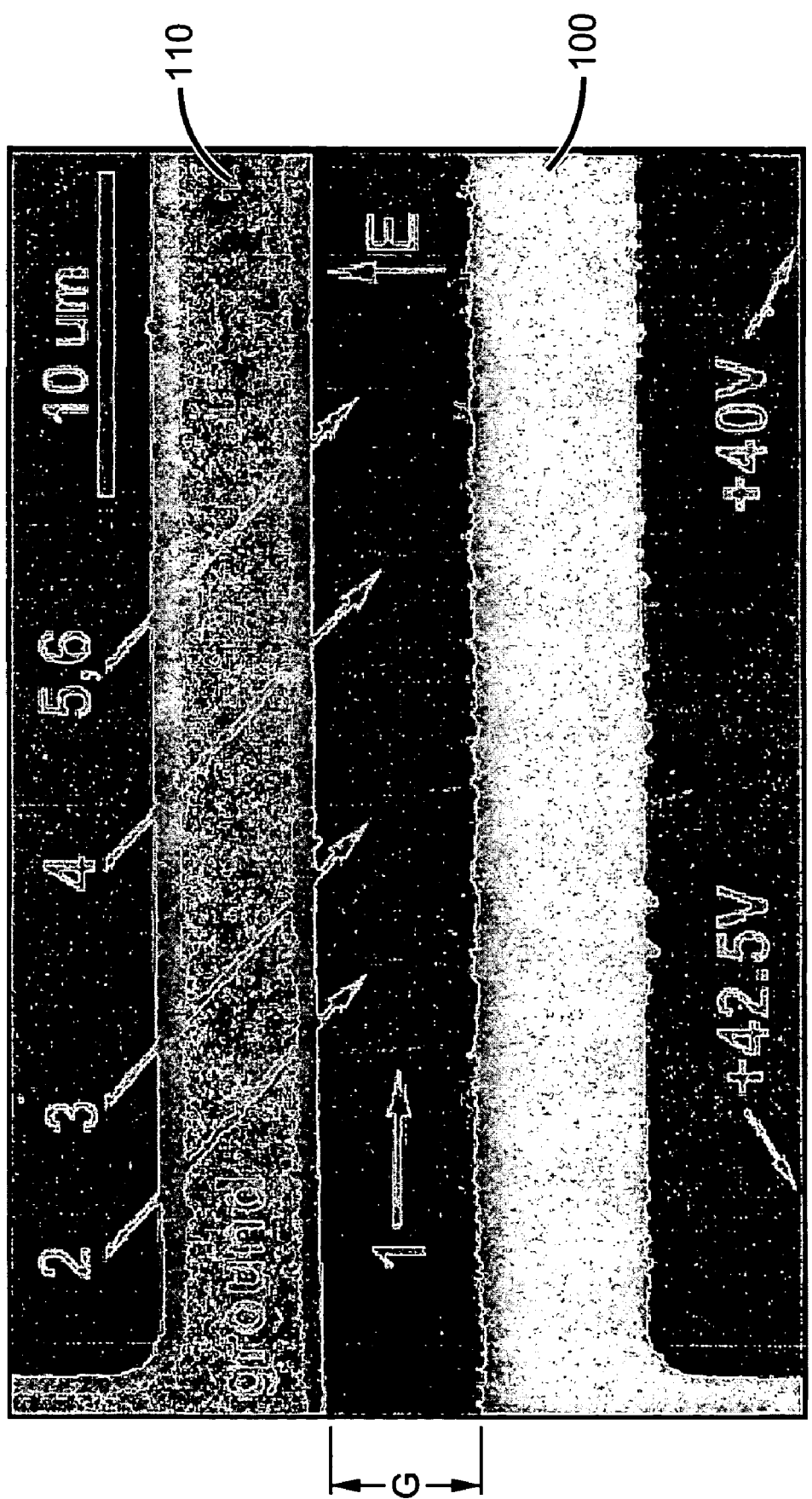

FIG. 20 is a SEM image of carbon nanotubes bridging a gap between parallel bridges of the configuration shown in FIG. 14, where CNT growth was enhanced by a strong E field between the microstructures, the gap was 5 μm, the growth time was twenty-one minutes, and the CNTs were multi-walled with diameters of 10 to 18 nm.

Figure 21:
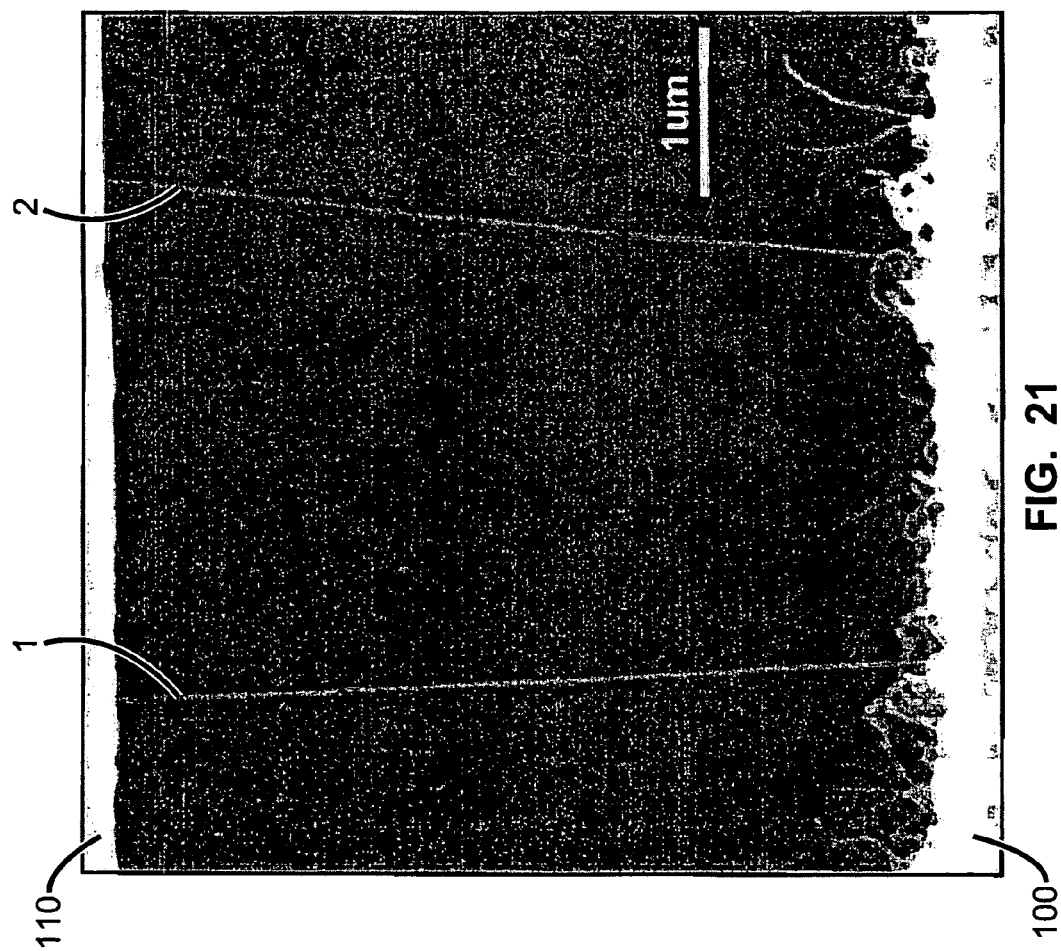

FIG. 21 is a SEM image of the two CNTs of FIG. 20.

Figure 22:
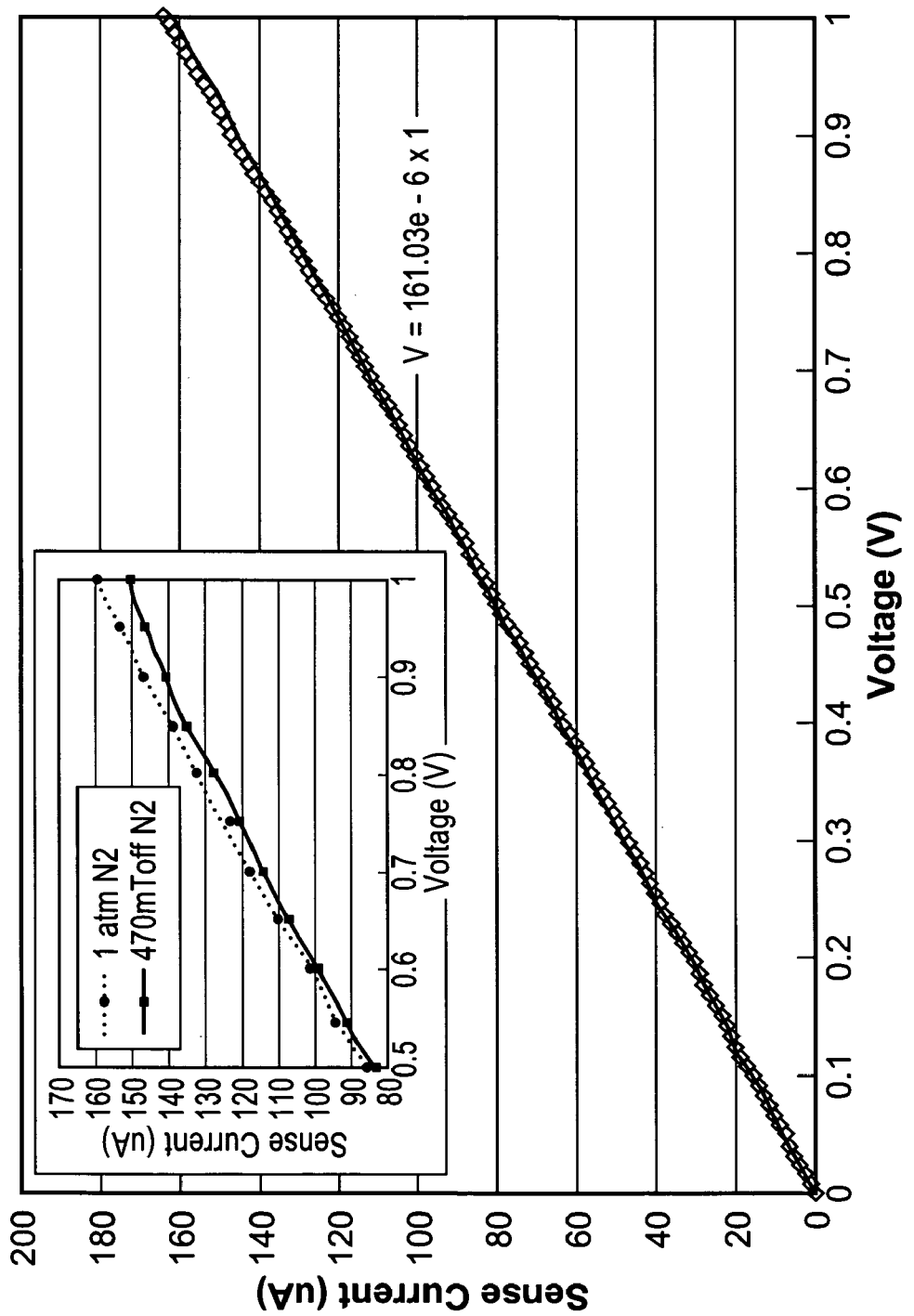

FIG. 22 is a graph illustrating the current-voltage characteristics of the CNTs shown in FIG. 20, taken in air, where the inset shows the I-V relationship in 1 atm dry N2 (top) and 470 mTorr dry N2 (bottom), and where the differential resistances were 7.8 k-ohm and 8.8 k-ohm, respectively, at 1V.

FIG. 23A and FIG. 23B are SEM images showing fractured CNTs where, at the left, a CNT is separated at the interface with the microstructure wall and where, at the right, a CNT is fractured away from the interface.

Figure 24:
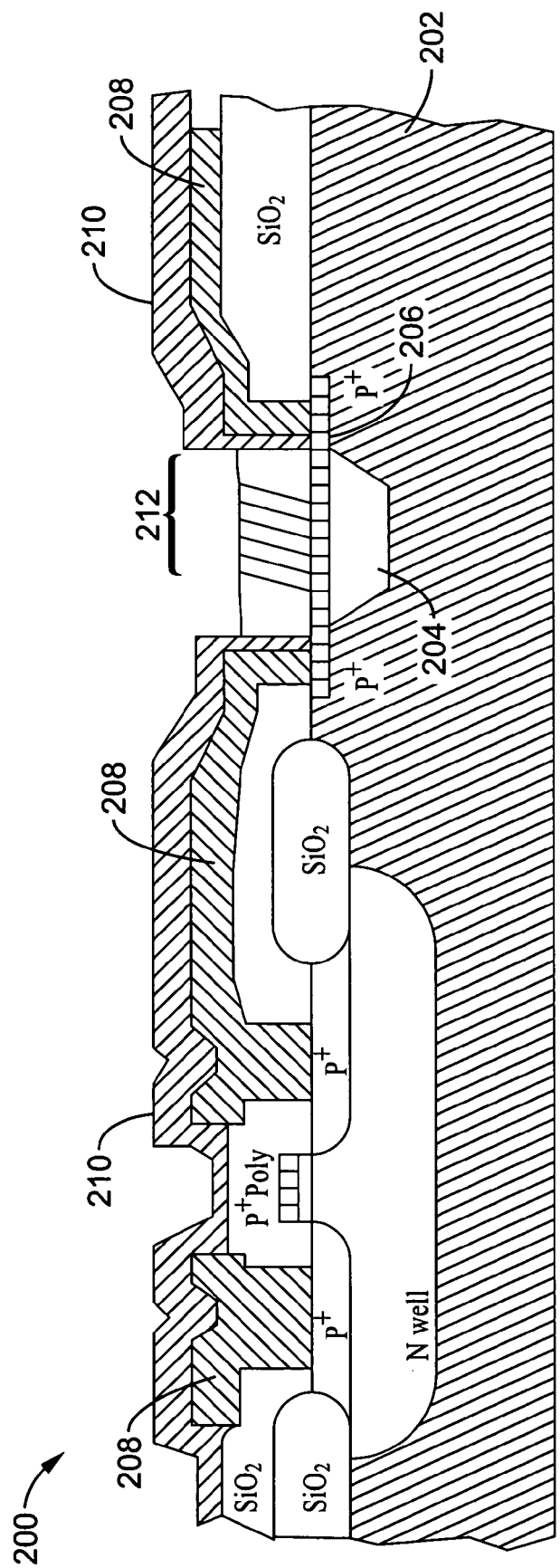

FIG. 24 illustrates the proposed NEMS synthesis, assembly and integration with combined nanostructures, microstructures and microelectronics on the same chip.

FIG. 25A through FIG. 25C illustrate a hierarchical assembly of ultra dense nanowires and nanotubes with built-in nano-level interconnections to accomplish a fully integrated nano-sensing system.

FIG. 26A-B and FIG. 27A-B illustrate various heating and thermal insulation characteristics of resistive microstructures in accordance with the present invention.

DETAILED DESCRIPTION OF THE INVENTION

For illustrative purposes the present invention will now be described with reference to FIG. 1 through FIG. 27B. It will be appreciated that the apparatus and/or system of the invention may vary as to configuration and as to details of the components, and that the method of the invention may vary as to the specific steps and sequence, without departing from the basic concepts as disclosed herein.

Integrated nano-electro-mechanical manufacturing is critical for the development of next generation nanosensors/nanoactuators. For the purposes of the following description, mechanical components with key dimensions less than 100 nanometers are defined as "nano" structures. There are two other types of systems that are related to nanoelectromechanical systems (NEMS). "Microelectromechanical systems" (MEMS) are generally defines as microscale mechanical structures with dimensions larger than 100 nanometers. "Mechatronics systems," on the other hand, are generally defined as electromechanical devices with size larger than a few millimeters.

EXAMPLE 1

Two types of suspended microelectromechanical systems (MEMS) structures were fabricated to serve as localized microresistive heaters for the synthesis processes: (i) polysilicon microstructures using a standard surface micromachining process, and (ii) bulk-etched single crystal silicon (SCS) microstructures based on a silicon on insulator (SOI) wafer. The synthesis processes were carried out in a growth chamber 10 having a vacuum chamber 12 at room temperature as shown schematically in FIG. 1. A treatment gas is supplied to the vacuum chamber 12 at inlet 14 via gas supply 16, and is controlled by mass flow controller 18. Microstructure 20 is positioned inside the vacuum chamber 12 and is connected to power supply 26 via leads 28. Vacuum pump 24 draws gas out of the chamber via outlet 22.

Figure 1:
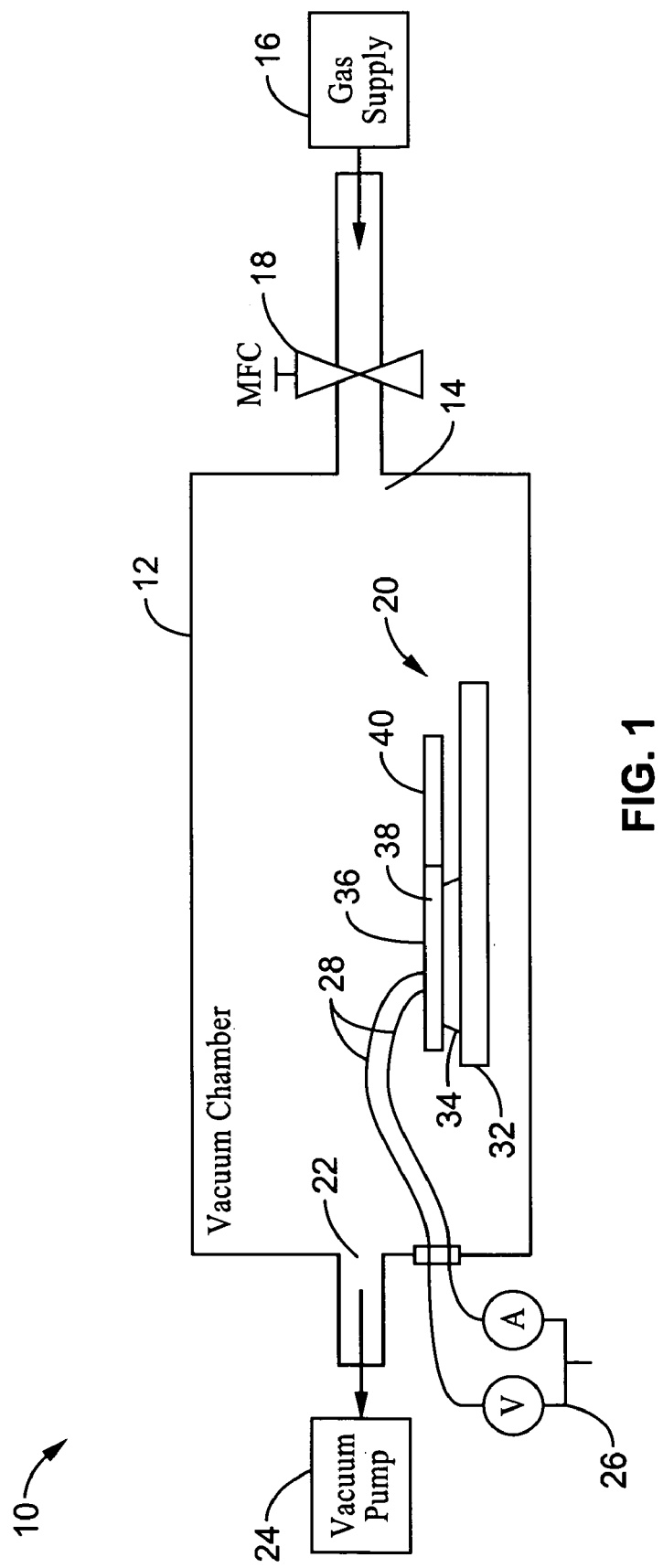
Figure 2A:
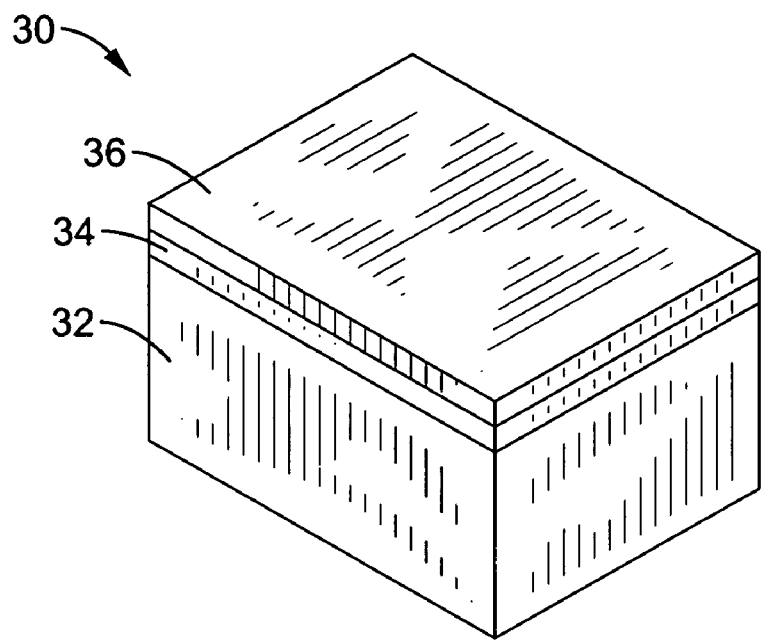

FIGS. 2A through 2G illustrate the fabrication of microstructure 20 and use in growth chamber 10 for generation of nanostructures. FIG. 2A illustrates an initial three-layer wafer 30 used to fabricate microstructure 20. The wafer 30 consists of a substrate 32, middle oxide layer 34, and silicon layer 36.

Figure 2B:
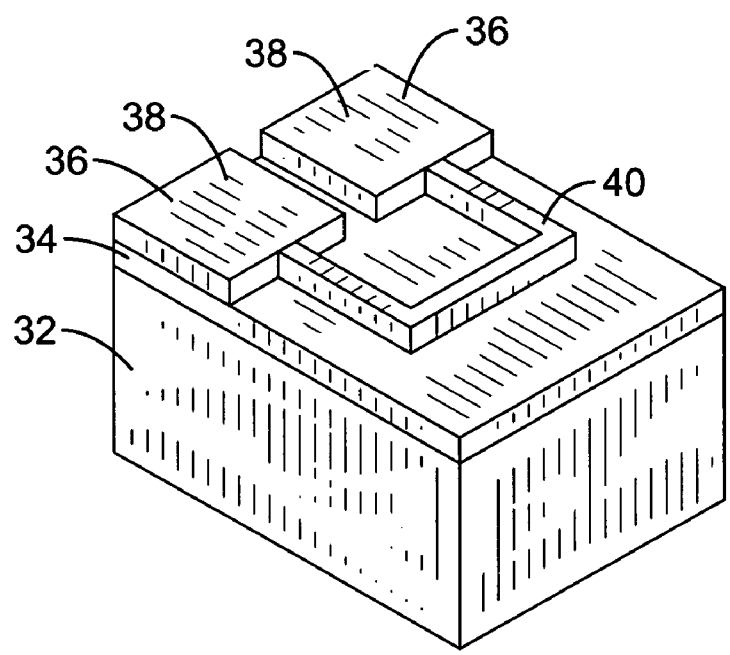

FIG. 2B illustrates the microstructure silicon layer patterning and etching. The silicon is etched to form two isolated pads 38 which are connected by u-shaped bridge 40.

Figure 2C:
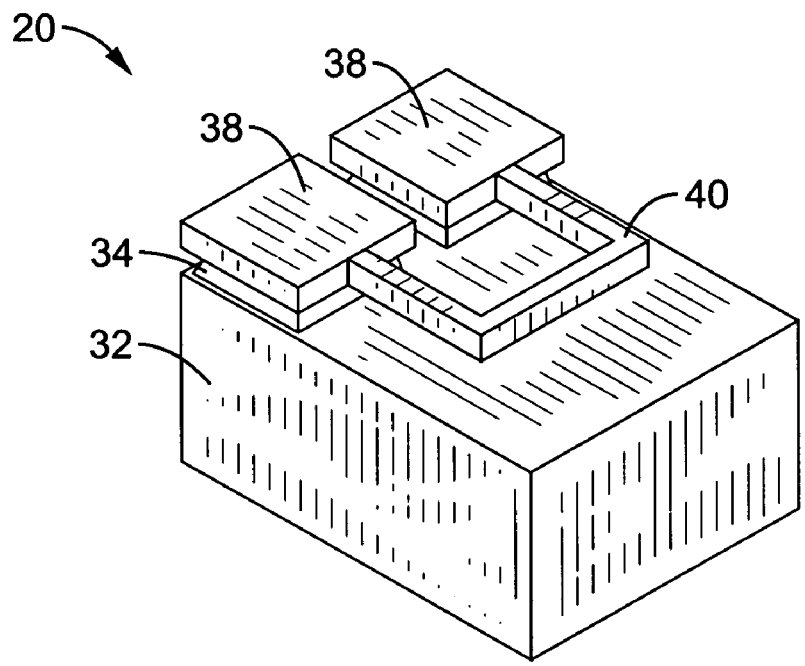

Referring now to FIG. 2C, sacrificial oxide layer 34 undergoes a timed etch to suspend bridge 40 to form microstructure 20. Oxide layer 34 is substantially removed, except for regions under electrical contact pads 38. The wet chemical release etching process naturally creates recessed regions underneath the electrical contacts, such that a maskless catalyst deposition process as shown in FIG. 2D cannot cause an electrical short-circuit.

In both cases, the microstructures 20 were heavily doped with phosphorus and suspended 2 μm, as defined by the sacrificial silicon dioxide layer 34, above the silicon substrate 32 for electrical and thermal isolation. The typical thickness of the bridges was 2 μm for polysilicon microstructures and 20 μm to 40 μm for SCS microstructures.

Figure 2D:
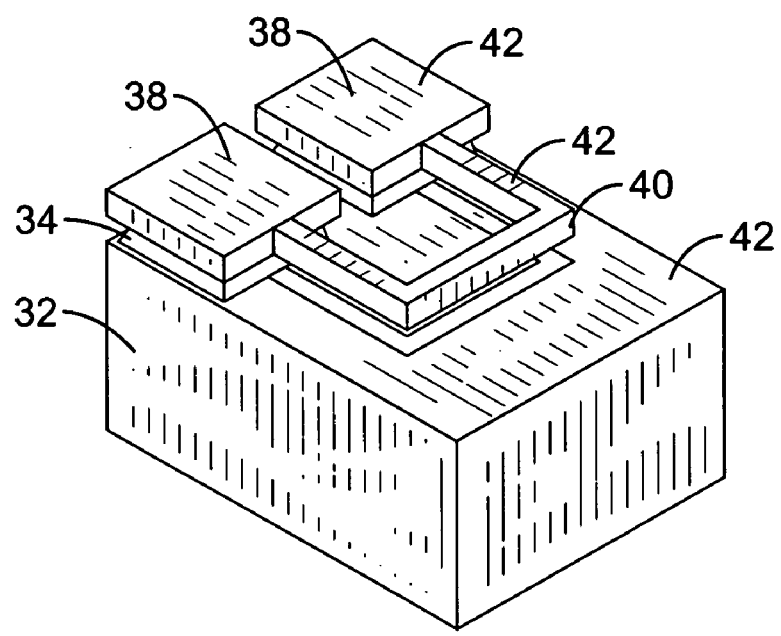

FIG. 2D illustrates the maskless catalyst deposition process. A thin catalyst layer 42 is deposited without a mask on bridge 40, pads 38 and substrate 32 except for the region directly under bridge 40 as illustrated in FIGS. 2D and 2G.

Figure 2E:
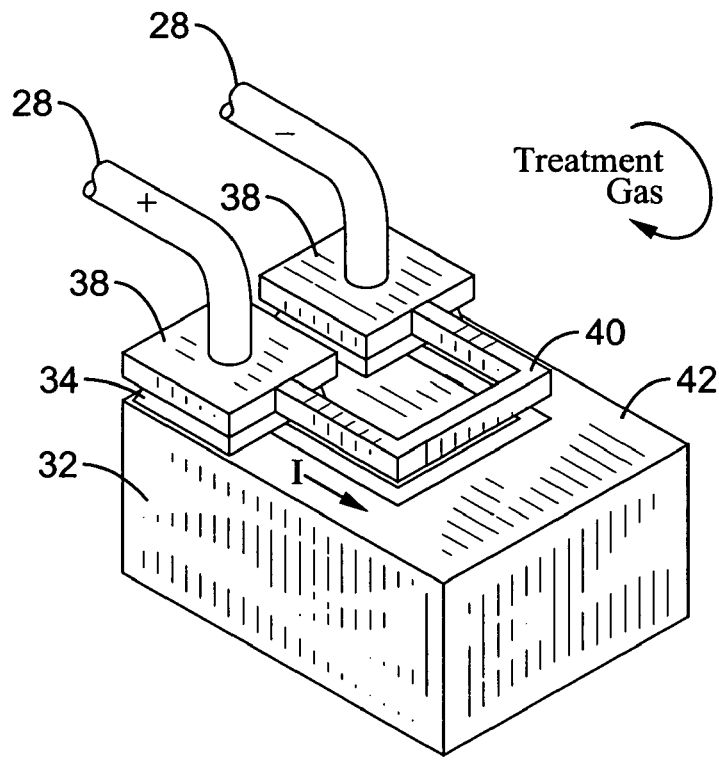
Figure 2F:
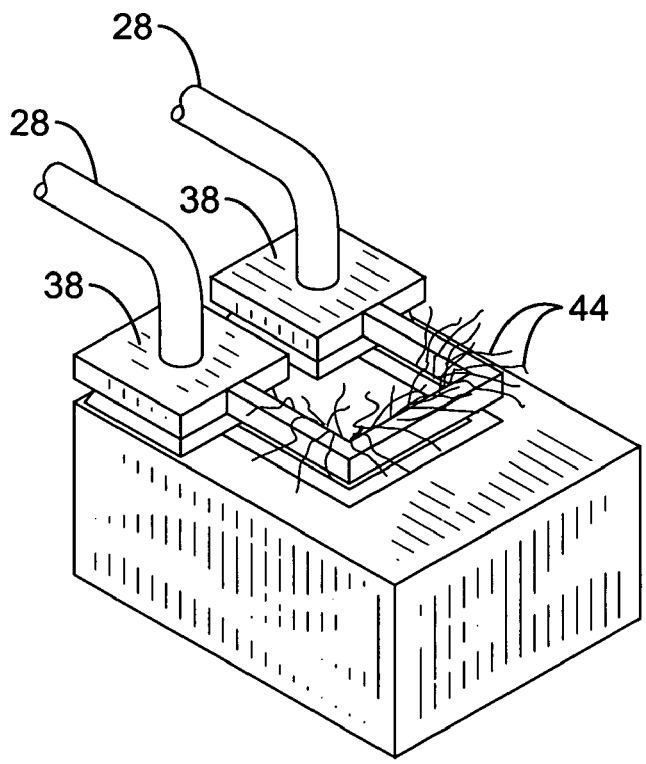

Referring now to FIG. 2E, the wire bond and electrical actuation in the desired gaseous environment of growth chamber 10 is illustrated. Leads 28 of opposite polarity are coupled to pads 28, and voltage is supplied by power supply 26 such that current flows across bridge 40, resulting in localized heating of the bridge 40 to generate synthesis of nanostructures 44 shown in FIG. 2F.

Figure 2G:
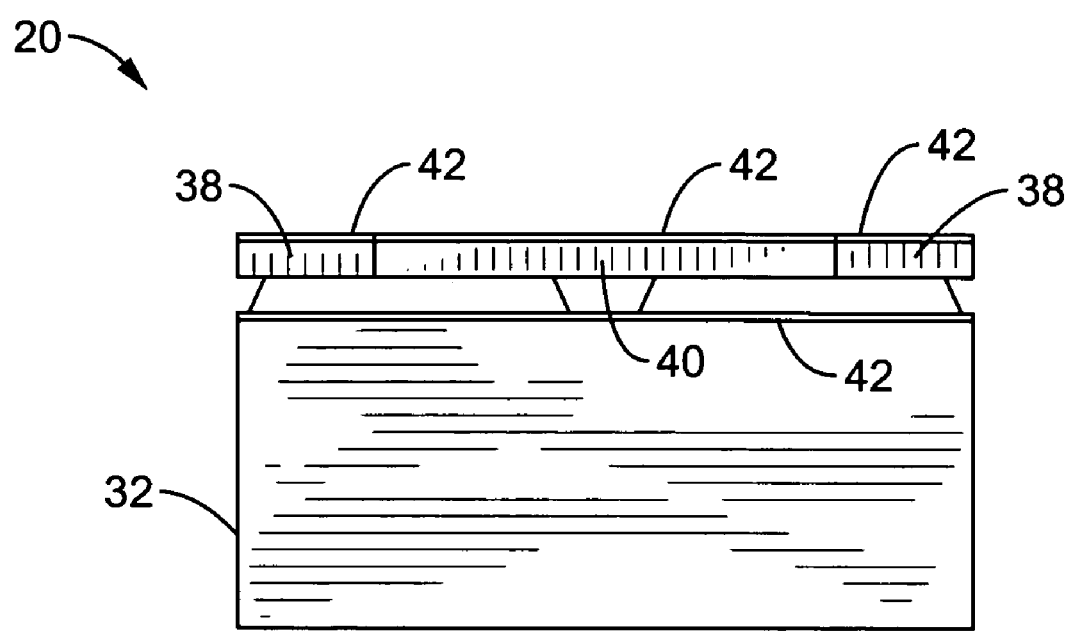

For the silicon nanowire synthesis, approximately 5 nm of a 60% gold-40% palladium (AuPd) mixture was sputtered onto the surface of the released microstructures to form catalyst layer 42 shown in FIGS. 2D and 2G. After attachment to a circuit board with electrical wire bonding as shown in FIG. 2E, the microstructures 24 were placed in the room temperature vacuum chamber 12. The vapor phase, silane (10% SiH4-90% Ar), was introduced at 350 mTorr and the microbridge 24 was resistively heated to initiate the silicon nanowire synthesis process.

It is believed that the VLS (vapor-liquid-solid) synthesis process can occur only under the correct experimental conditions of temperature, gas pressure and suitable catalyst. The VLS mechanism was first proposed in the 1960s to describe whisker growth and recently has been confirmed as responsible for nanowire growth. In the context of silicon nanowires, the VLS reaction proceeds when silicon from the decomposition of silane interacts with the catalyst's surface. The silicon diffuses into the catalyst; upon reaching the silicon-catalyst eutectic point, the alloy becomes liquid phase. Various metallic catalysts (Ni, Fe, Ti, Zn, Au and AuPd) have been shown to effectively facilitate this reaction, with gold most commonly used. The liquid alloy continues to absorb silicon until it becomes supersaturated and silicon begins to precipitate at the liquid-solid interface. Nanowires then form as a result of this axial precipitation process. Since precipitation occurs at the solid-liquid interface, a catalyst nanoparticle present at the free tip of the nanowire is often characteristic of this process. The initiation of the reaction is temperature-dependent; the eutectic temperature and the temperature for silane decomposition must be reached for the reaction to proceed.

In practice, by applying and steadily incrementing the voltage while recording the current, localized resistive heating of the suspended bridge 24 can be monitored. The current-voltage relationship for a representative U-shaped MEMS structure is shown in FIG. 3 and additional process parameters are presented below in Table 1.

The current-voltage curve 50 is characteristically linear under low input power and becomes non-linear when input power is increased, due to local high temperatures and secondary effects. It was observed that the microbridge exhibited a non-linear current-voltage relation near the desired synthesis temperature. The temperature on the microstructures is characterized base don the geometry, doping level, and current-voltage characteristics. Once the desired temperature range is obtained, the reaction was allowed to proceed for approximately 15 minutes. At the end of the process, the gas flow is terminated and the power supplied to the microstructure is slowly decreased to prevent rapid cooling and possible thermal shock to the structures.

FIG. 4A shows the synthesis of silicon nanowires 44 on a 100 μm long, 5 μm wide and 1.5 μm thick polysilicon microbridge 40 under localized joule heating for 15 minutes. Silicon nanowire growth spanned approximately 35 μm across the length of microbridge 40 at the center of the 100 μm long microbridge. These nanowires are 30 nm to 80 nm in diameter and up to 5 μm in length. The oblique view microphoto around the center region in FIG. 4B and the top view microphoto at the edge of the growth region in FIG. 4C clearly show location-dependent growth patterns as the result of a nonuniform temperature distribution on the microbridge.

From the foregoing, it also appears that the microbridge 40 in FIG. 4A has buckled downward toward the substrate during synthesis due to compressive stress generated by thermal expansion of the bridge microstructure. As a result, the temperature at the center of the bridge 40 lowered due to better heat dissipation to the substrate, and the nanowires in this area grew more slowly as evidenced in FIG. 4B. Different microbridge configurations can be used to eliminate this effect. At the growth/nongrowth interface region in FIG. 4C, breakdown of the thin gold-palladium film 42 into nanoparticles was observed. However, it appears that the temperature in this area was not sufficient for the formation of silicon nanowires.

Relatively large sizes of the nanoparticles were formed. It is believed that the size of the nanoparticles plays an important role in nanowire synthesis. Furthermore, the temperature field, and type of the catalyst and the nature of the surface can affect the formation and the size of the nanoparticles.

In FIG. 5, localized nanowire growth 44, spanning approximately 55 μm of the 100 μm long beam 40, originates on one polysilicon microstructure and transcends a 5 μm wide gap to rest on an adjacent structure 52. The potential for these nanowires to be integrated with larger systems and serve the purpose of interconnects is clearly illustrated by this sample. The high resistivity of these intrinsic nanowires has limited their electrical analysis.

Figures 5A, 5B:
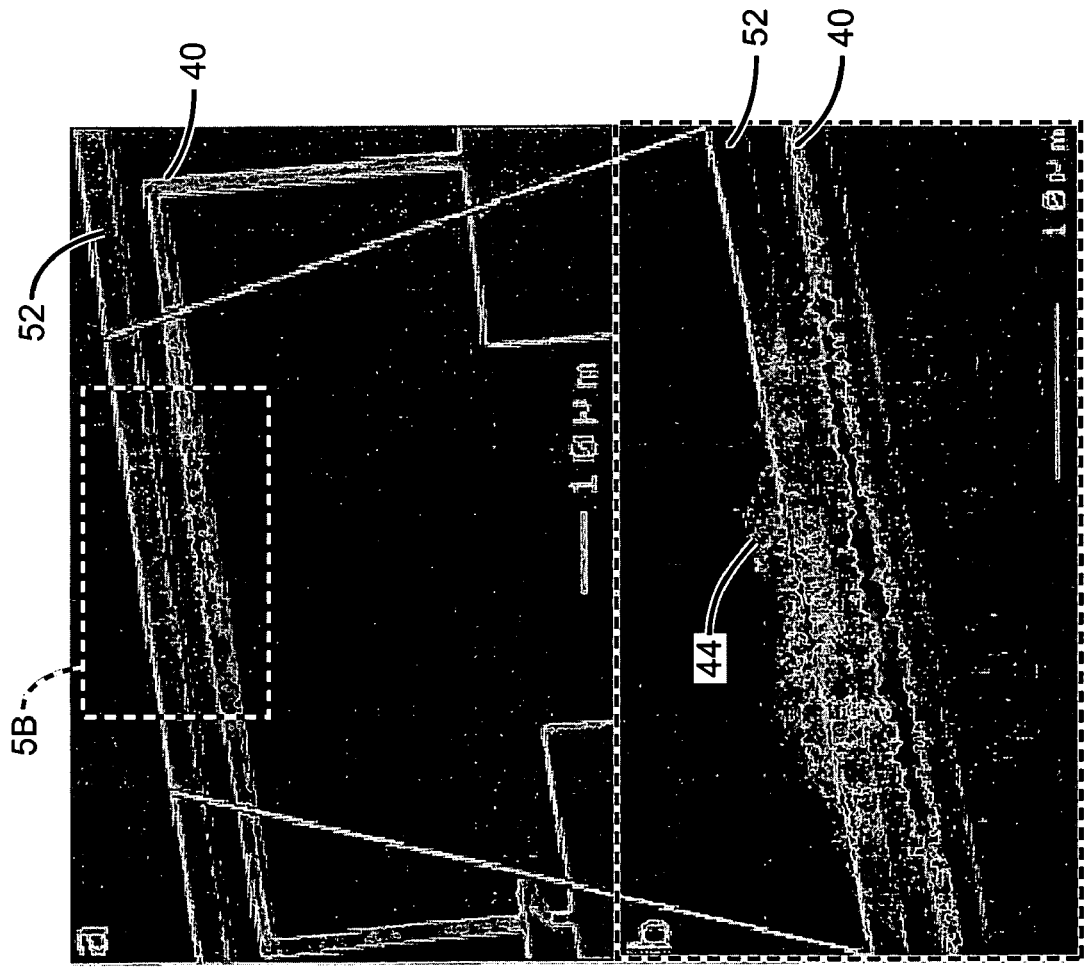
Figure 6:
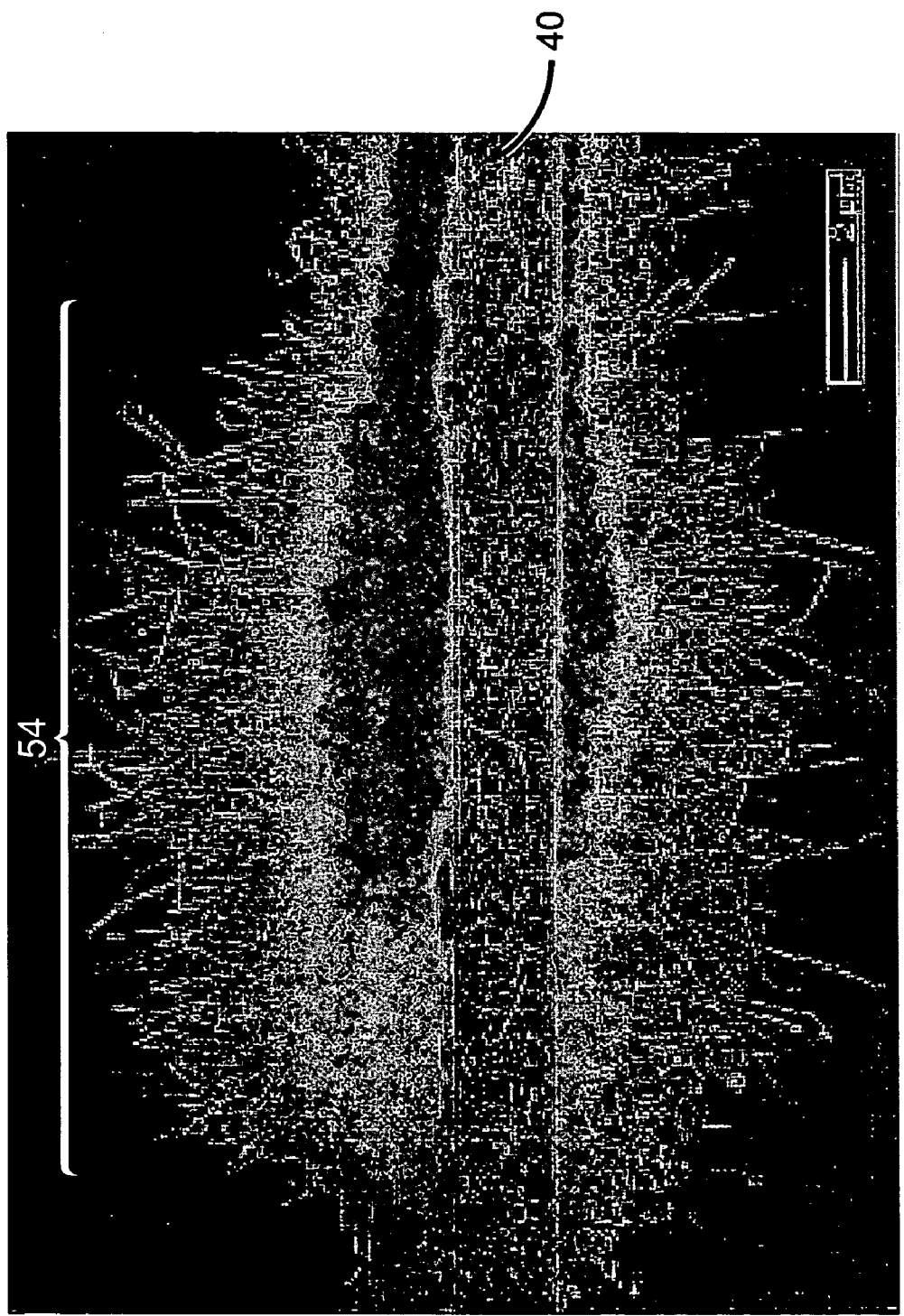

FIG. 6 shows a high-resolution SEM image of silicon nanowires on a SCS microstructure. Here the flexibility of the process is illustrated as the synthesis reaction may proceed on various MEMS platforms fabricated by different processes. In addition, the nanowire growth 54 appears denser and individual nanowires appear straighter and stiffer in comparison to the nanowire growth in FIG. 4 and FIG. 5.

Generally, the nanowires grow approximately 30 nm to 80 nm in diameter, up to 10 μm in length, and at rates up to 1 μm/min. The nanowire diameter is a function of the initial catalyst diameter and is seen to be larger than the catalyst, while the length is a function of growth time. The growth rate appeared to be related to the size of the liquid alloy as well as the synthesis temperature and gas pressure.

One can conclude that the localized silicon nanowire synthesis process is a strong function of local temperature, and there appears to be an "ideal temperature window" at which the reaction takes place. The gold-silicon eutectic temperature is approximately 363° C. and the presence of palladium is expected to slightly increase this temperature, as evidenced in the related phase diagrams. The decomposition of silane takes place over a wide temperature range. The thermoelectric model yields a characteristically parabolic temperature distribution, seen in FIG. 7 for the sample shown in FIG. 4, with hottest region located in the center of the structure. The model suggests that the reaction, and therefore growth, took place between 600° C. to 700° C. for this sample. This model assumes sufficient doping level and a perfect crystal structure since insufficiently doped microstructures cause the current-voltage characteristic to vary considerably. This temperature estimate was confirmed with visual observation of the microstructure's color in the non-linear region.

As previously discussed, the resistive heating technique ideally locates the hottest region at the center of the structure. It is observed that nanowires can grow at specific regions of the microbridge depending on the profile of the applied temperature. When the ideal temperature window matches the ideal hottest region at the center of the structure, the growth region generally spans between 30% to 55% of the structure's length. If the center temperature is too high, the majority of the growth occurs in two separated regions, relatively symmetric to the center; the extent of the growth region is decreased to only 10% to 20% of the total length.

Figure 7:
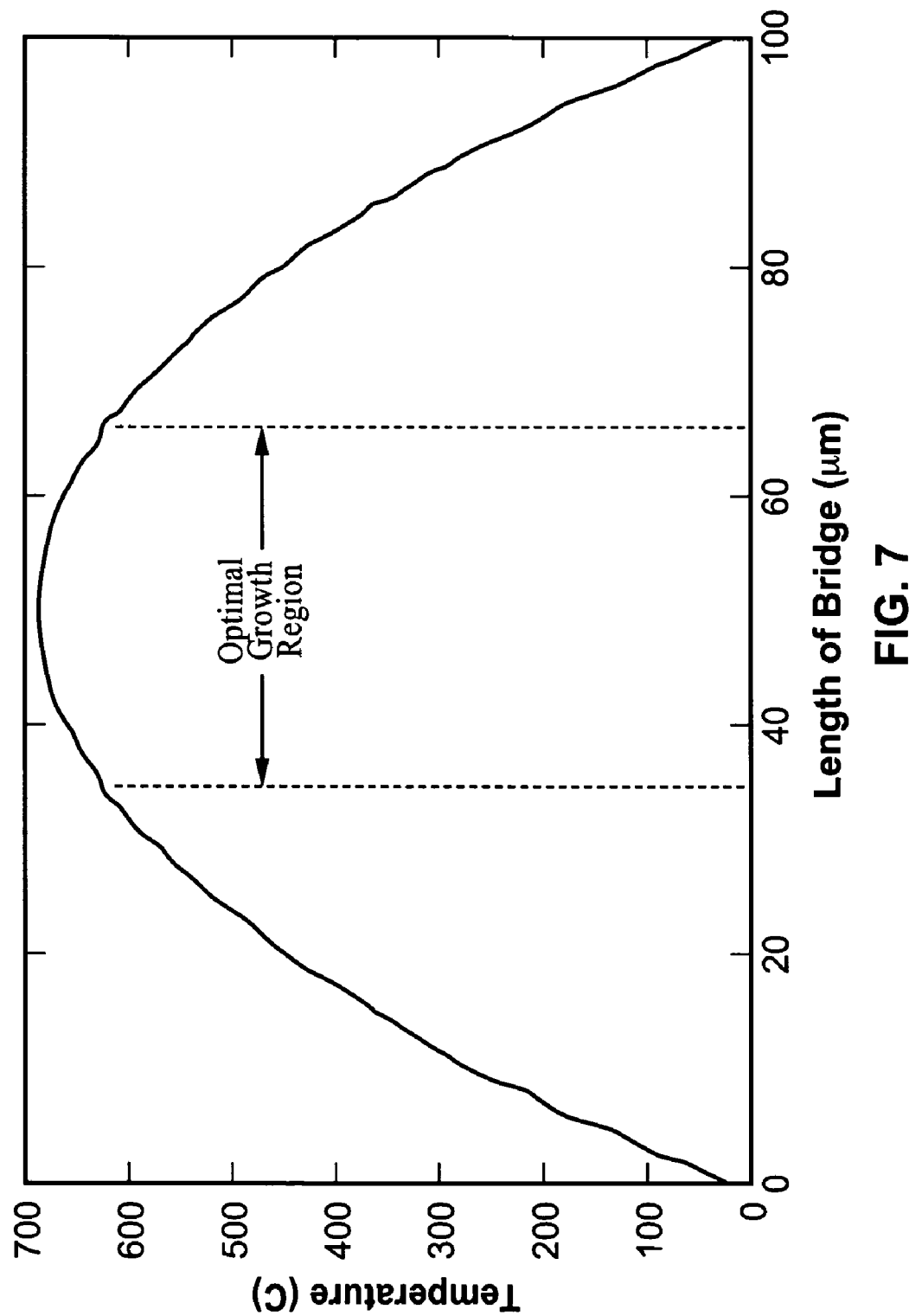

The smaller growth region is the result of the parabolic temperature distribution through the structure as can be observed in FIG. 7. That is, the temperature gradient is greater at points away from the center of the structure leading to more significant temperature drop over a smaller region and thereby reducing the area of the bridge spanned by the ideal temperature window. These experimental results strongly suggest that the synthesis of silicon nanowires depends on a suitable temperature window with lower and upper limits. Since the activation of the reaction is a function of temperature, the growth is determined by the temperature regime in the microbridge. The location of the ideal temperature window for growth can be adjusted by altering the applied voltage, thus eliminating the need to lithographically define growth regions. In all growth cases, this region was stable for sufficient time to allow nanowire growth. The only limitation on this approach is the melting temperature of the microstructure (1440° C. in this case for silicon). This analysis illustrates an additional advantage of this approach, as a wide temperature distribution from room to high temperature (close to the melting temperature of silicon) can be tested to characterize the growth of nanowires at various temperatures in a single experiment.

As can be seen, therefore, the present invention provides for room temperature synthesis of nanowires in direct contact with MEMS structures. The process has yielded localized regions of silicon nanowires, 30 nm to 80 nm in diameter and up to 10 μm in length. Growth rates of up to 1 μm/min have been observed. The inventive process allows for immediate, direct integration of nanostructures with larger scale systems and furthermore permits the placement of these nanostructures at desired locations along the surface of the larger scale system using the concept of localized heating. This process, therefore, eliminates the need for additional assembly steps and provides a CMOS-compatible technique for the integration of nanotechnology.

EXAMPLE 2

For nanotube synthesis, the same method and phenomena described above with respect to nanowire synthesis are employed. In this embodiment, a thin metal layer 42 was evaporated over the entire chip to serve as a the catalyst for growth. A mixture of approximately 5 nm nickel, iron, or Ni—Fe (80% to 20% by weight) was used as the catalyst, with higher growth rates occurring when iron was present (e.g., see FIG. 2D). After wirebonding for electrical connectivity, the microstructures were placed into a room temperature vacuum chamber (e.g., see, FIG. 2E). The organic vapor phase, acetylene (C2H2), was introduced at 245 mTorr to supply carbon and the microstructure was heated to initiate nanotube synthesis (e.g., see FIG. 2E). With the acetylene pressure constant at 245 mTorr, growth occurred at 0.25 μm/min at optimal temperature locations. Note that growth rate may also depend on the pressure. Note also that carbon nanotube (CNT) growth requires higher temperatures for the synthesis reaction to occur as shown in FIG. 9E; higher voltages and currents are therefore required for similar MEMS microstructures.

FIG. 8 shows a sample microstructure I-V curve for a U-shaped microbridge 40, where FIG. 9A through FIG. 9J are microphotos of a 150 μm long microstructure during actuation. These microphotos correspond to points 9A-9J on the graph of FIG. 8. In practice, by monitoring the current while applying and steadily incrementing voltage, localized resistive heating of the suspended bridge 40 can be controlled. The temperature on the microstructures is assessed based on the geometry, doping level, and current-voltage characteristics. We have found in practice that growth tends to be fastest in the regions where the microstructure is glowing lightly in the optical spectrum. When the temperature gets too high, as evidenced by a very strong glow, the rate of growth diminishes greatly. The curve 56 of the current voltage relationship shown in FIG. 8 is characteristically linear under low input power and becomes non-linear as input power is elevated due to local high temperatures and secondary effects.

Figure 10:
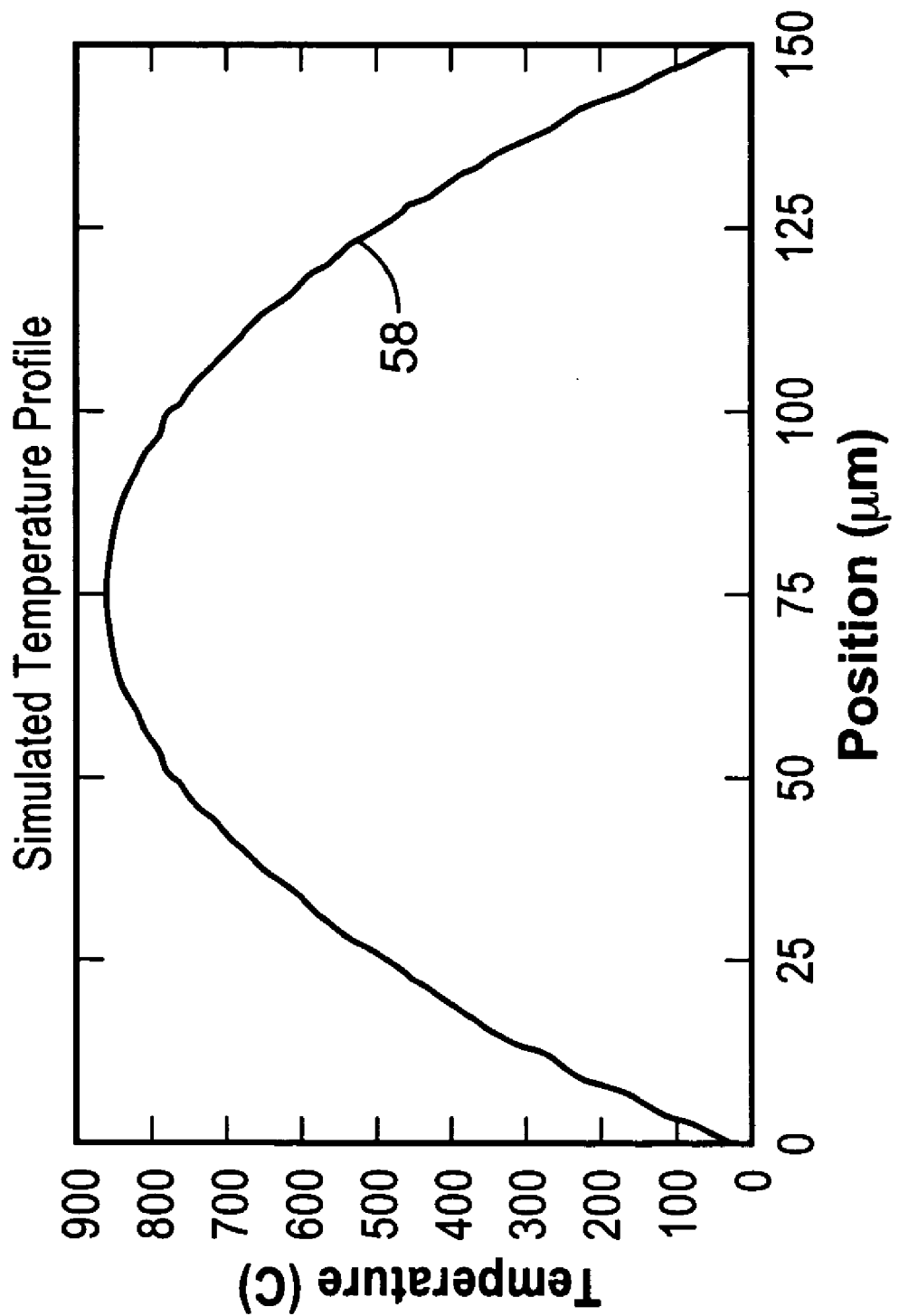
FIG. 10 is graph showing a simulated temperature profile of the microbridge of FIG. 8 during activation in accordance with the present invention.

FIG. 10 illustrates the temperature profile curve 58 along the length of the 150 μm long bridge 40. The temperature profile curve 58 is substantially parabolic, with the peak temperature of about 860° C. at the center of the bridge 40.

Figure 11:
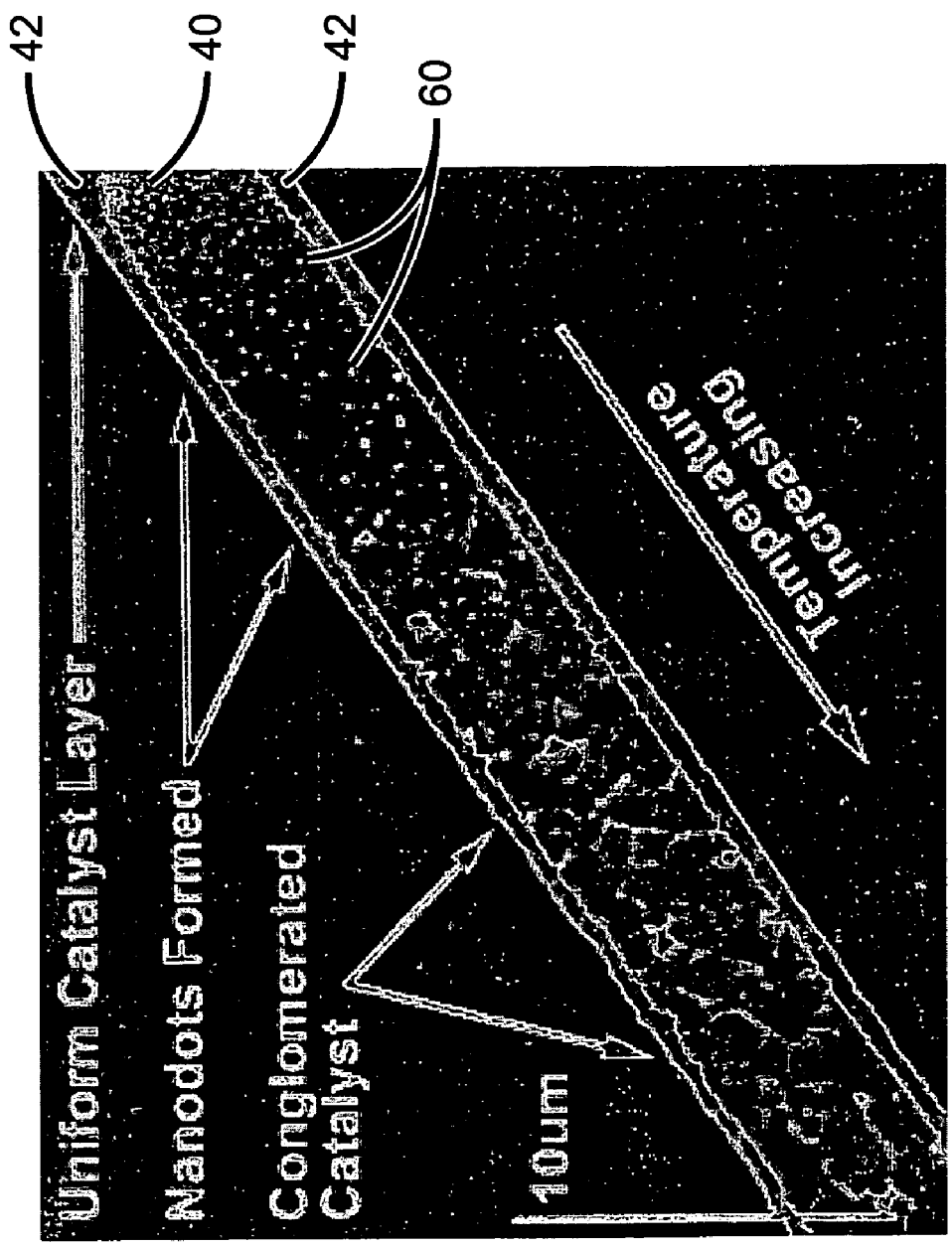
FIG. 11 is an SEM image showing thin-film catalyst behavior under resistive heating of an underlying microstructure, and illustrating that rapid overannealing before CNT growth causes the thin film to conglomerate, which is undesirable for CNT growth.

The chemical vapor deposition synthesis process is understood to be composed of a series of chemical reactions; all depend strongly on the local temperature. The thin catalyst layer 42 breaks down into discrete nanoparticles 60, as seen in FIG. 11, at the catalyst surface the acetylene vapor decomposes into carbon and hydrogen gas, subsequently forming a liquid catalyst-carbon alloy. During the synthesis process, the alloy continues to absorb carbon until it becomes sufficiently saturated; at the liquid-solid interfaces carbon then precipitates from the alloy and self-organizes in the form of nanotubes. The dependence on temperature of each of these reactions implies that a minimum temperature that must be reached before synthesis is activated. Since the temperature profile on the microstructure spans a room- to high-temperature range (25° C. to 1000° C. or higher), it is possible to examine the temperature dependence of the vapor deposition synthesis process using microstructure heating.

By rapidly heating the microstructure prior to growth, the catalyst layer 42 can be caused to conglomerate in certain regions, while nanodot morphology 60 is restricted to a narrow region. Catalyst nanodots are desired for single-walled CNT growth, and the geometry of CNTs is directly linked to the size and shape of the catalyst nanoparticle. Thus, by localizing the nanodot region, synthesis parameters associated with desirable CNTs will be localized accordingly. By choosing the catalyst appropriately, diffusion and alloying with the silicon will not alter the electrical properties of the microstructure by catalyst overannealing.

Experimentally, nanotube growth occurred at a rate of approximately 0.25 μm/min in the optimal-temperature regions. CNTs have been synthesized up to 7 μm in length, and 5 nm to 50 nm in diameter. The diameters of the CNTs are very uniform across each growth region.

FIG. 12A shows CNT growth across the central portion 74 of a "pointed" U-shaped microstructure 70. These nanotubes resulted from a 10-minute synthesis period, and are approximately 0.5 μm to 2 μm long in the region shown. Note that there are no CNTs on the substrate 72, though a catalyst layer 42 was deposited on that surface. Closer SEM examination shows that the catalyst 42 under and near the bridge 70 has received insufficient heating to melt it or alter its morphology in any visible way. This indicates that the substrate 72 was able to dissipate the input radiative and conductive thermal energy without experiencing a significant temperature elevation, which is significant if the substrate 72 contains microelectronics from prior processing.

FIG. 12B shows CNTs 76 near the center 74 of this actuated region. Since there is no external force to orient or control the growth parameters, they appear to grow imperfectly. These CNTs are estimated to be 15 nm in diameter.

FIGS. 13A and 13B show CNT growth localized mainly to the legs of a "U-shaped" microstructure 40 and similar to the electrically actuated microstructure of the optical photographs of FIG. 9A through FIG. 9J. It was seen that there is a distinct temperature range at which carbon nanotubes will grow, and this can be used to select the synthesis region, between an area that is too cold (<700° C. for single-walled CNT) and one that is too hot (>1000° C.). The series in FIG. 9A-J shows that the growth region (barely glowing) can be isolated to a desired location on the microstructure. Each "hot spot" was stationary and stable for sufficient time to grow nanotubes of at least 5 μm. FIG. 9J illustrates the microstructure just before failure due to melting (1400° C.). The growth shown in FIG. 13A occurred on a microstructure powered between data points 9F and 9H in FIG. 8. The nanotubes shown in these figures are 10 nm to 50 nm in diameter and up to 5 μm in length. It appeared that these nanotubes are multi-walled due to their size and the structural integrity visible in SEM microphotos.

The microstructures' maximum temperature was observed to be located not at the center, but skewed off-center by as much as 20% of the microstructure's length. The skew was always in the direction of the cathode for both polysilicon and SOI microstructures and was most pronounced in the "U-shaped" devices. This off-center heating is presumed to be due to the Thomson Effect whereby heat is evolved and absorbed in different regions of a conducting element due to the electrical current. When designing microstructures for localized synthesis, this should be taken into account. In addition, if the microstructures are insufficiently doped, the I-V characteristic is altered drastically and temperatures are much less predictable. This can be attributed to secondary effects such as electromigration, grain growth, and localized melting. Highly doped microstructures were significantly easier to drive to a repeatable temperature profile and made it possible to maintain the desired profile for the duration of the synthesis.

As can be seen, the synthesis of nanotubes in direct contact with MEMS structures has been demonstrated in a room temperature environment. The method has yielded localized regions of carbon nanotubes, 5 nm to 50 nm in diameter and up to 7 μm in length. Growth rates of as high as 0.25 μm/min were observed. This process allows for the direct integration of nanostructures into larger scale systems and permits the placement of these nanostructures at desired locations along the surface of the larger scale system using localized heating of a highly doped microstructure. In addition to eliminating the need for post-synthesis CNT assembly, this process provides a technique for integration of nanotechnology that is fully microelectronics-compatible.

EXAMPLE 3

We also demonstrated that orientation of nanotubes 76 is a function of the electric field E as shown in FIGS. 13A-B. The bottom right side 80 of this "U-shaped" microstructure 40 was taken to approximately 7V, while the bottom left side 82 was grounded, yielding an electric field of approximately 0.12 V/μm in the region where the longest growth occurred. This region is further detailed in expanded view of FIG. 13B which shows the CNT from outside the microstructure 40 curving with the electric field E. This electric field is weaker than desirable for oriented CNT growth, but shows that the electric field due to the synthesis process alone can be used to orient the tubes. The addition of additional electric field, by increasing the potential difference between nearby microstructures, will enhance this effect.

It will be appreciated that assembly is probably the most difficult task in any nanostructure integration process. To facilitate assembly, the present invention uses electric field oriented growth, in combination with the above-described localized growth, to accomplish the synthesis and assembly in a single step, saving time and cost associated with post-synthesis assembly. The influence of an electric field on nanostructure growth can be exploited for self-assembly into larger devices without the need for making separate connections between the nanostructures and the other devices. This facilitates nano- to micro-integration in ways not previously achieved.

Referring now to FIG. 14, an embodiment of a system for localized oriented growth of nanowires and nanotubes according to the present invention is illustrated schematically. In FIG. 14, the suspended growth bridge 100 spans across pads 102 and 104. When a suitable current is passed from positively charged pad 102 to negatively charged pad 104 to achieve the proper synthesis temperature, nanostructures 108 such as silicon nanowires or carbon nanotubes can be selectively synthesized at the center region 106 of the bridge 100 as described previously. At the same time, bias bridge 110 is positioned opposite growth bridge 100. Bias bridge 110 is biased negatively with respect to growth bridge 100 such that a local electrical field E is established that will direct the growth direction of nanostructures 108. When the hot tips of nanostructures 108 reach bias bridge 110, they are cooled down and the growth process stops naturally. In the VLS growth mechanism, the tips of the nanowires/nanotubes will be the catalyst metal in the form of eutectic liquid and easily form an ohmic contact at bias bridge 110 (e.g., if gold is used as the catalyst metal). Therefore, it can be seen that by using this localized synthesis and self-assembly manufacturing process, it is possible to fabricate a two-terminal nanodevice.

It will be appreciated that other biasing configurations can be employed for oriented growth as well. For example, FIG. 15 schematically shows a "heactuator" type MEMS structure 120 that works as the bias bridge for the self-assembly process and later functions an actuator to move and actuate nanostructures. The heactuator structure 120 has bias bridge composed of a cold arm 122 and hot arm 124 positioned relatively normal to extended growth bridge 128. When a current is applied to the structure 120, the thinner hot arm 124 of the heactuator 120 has higher electrical resistance than the cold arm 122, thus expanding more under resistive heating. As a result, the tip 126 of the structure will move to the right to test the mechanical properties of the nanostructures similar to a material testing machine.

EXAMPLE 4

The dual-bridge system shown in FIG. 14 was used for synthesis and self-assembly of silicon nanowires, as illustrated in FIG. 16. The growth bridge 100 and bias bridge 110 (actuated and secondary structure) were positioned with the end portions parallel to each other and spaced apart with gap G ranging from approximately 4 μm to 10 μm. Growth bridge 100 was locally heated as described above to initiate the nanowire synthesis process. Bias bridge 110 was operated at a lower voltage to create an electric field E. Bias bridge 110 was biased negatively with respect to growth bridge 100, since the electric field E is realized as a result of the difference in voltages between the opposing structures. The synthesis time was increased with gap size G, since the nanowire growth rate is approximately 1 μm/min.

FIGS. 17A-B show the results using two 50 μm-thick micro bridges made from SOI (silicon-on-Insulator) wafers with a gap G of 10 μm. As seen in FIGS. 17A-B, suspended nanowires 130 span growth bridge 100 and bias bridge 110 to bridge the gap G, and are localized to specific areas of the actuated structures, In this case, bias bridge 110 was coupled to the grounded side of the structure using a resistor, and the electric field varied linearly between the structures and the voltage drop through the growth bridge 100.

The mechanical strength of the contact is illustrated in FIGS. 17A-B, where a large piece of silicon debris 132 is suspended in place by a few nanowires 130. A good bond to the bias bridge 110 was observed due to the properties of VLS mechanism, where the liquid phase metal catalyst at the free tip of the nanowire makes ohmic contact with the cold bias bridge 110.

Current-voltage relationships for a number of representative samples of self-assembled silicon nanowires are shown in FIG. 18. The conductance through the nanowires is compared to the background noise. The slopes of the curves correspond to the high resistance values which are expected for intrinsic silicon nanowires. The slope represents the total resistance since it is also a function of the number of nanowires making contact with the secondary structure. As expected, these intrinsic silicon nanowires are only capable of carrying picoamps of current. The slopes of the curves yield a total resistance value on the order of 1012 ohms. Assuming approximately 10 nanowires of 10 μm-long and 50 nm in diameter make contact, the resistivity of a single nanowire is on the order of 105 ohm-cm which is in good agreement with theoretically derived values.

EXAMPLE 5

FIGS. 19A-C show silicon nanowires linking two semi-circular bridges. The opposing semicircular structures in FIG. 19A-C illustrate the role of the electric field in guiding intrinsic silicon nanowires. Here, the actuated structure, or growth bridge 140 was taken to approximately 10V while the secondary structure, or bias bridge 142, was biased at −20V. This setup provides for the strongest electric field at the center and a weaker field towards the edges. It was found that nanowires 144 align with the electric field E, especially in the center region that has the strongest electrical field.

The gap G in this configuration was 5 μm at the center and 105 μm at the edges. FIGS. 19B-C illustrate that the nanowires 144 respond to the presence of the electric field E. FIG. 19B illustrates the center section of the dual bridge interface, where the electric field E is perpendicular to the structures. As shown in FIG. 19B, the nanowires 144 are perpendicular to the structures as well. As seen FIG. 19C showing a section toward the side of the dual bridge interface, clear tilting in the nanowire orientation was visible, which is consistent with the orientation of the electric field E.

EXAMPLE 6

The dual-bridge system of FIG. 14 was also used for fabrication of CNTs. FIG. 20 shows two microstructures with six nanotubes spanning a 5 μm gap between the bridges. The growth time was twenty-one minutes, and the CNTs grown were multi-walled with diameters of 10 to 18 nm. The bottom microstructure (growth bridge) 100 is the "hot" source for the growth of CNTs and the top microstructure (bias bridge) 110 is the "cold" end, where the CNTs stop growing once their growing tips reach the microstructure 110. The applied local electric field was 10 V/μm across the gap.

FIG. 21 shows a higher magnification SEM image of the leftmost two nanotubes CNT 1 and CNT 2. In this synthesis process, the bottom-right bond pad was held constant at +40V, while the bottom left bond pad was held at +42.14V. The top microstructure 100 was grounded, giving a roughly-constant electric field of 10 V/μm across the entire gap. This caused the nanotubes CNT 1 and CNT 2 to orient strongly during growth and contact the parallel microstructure, at which time they bonded irreversibly.

The as-grown suspended multi-walled CNTs were observed to make high-quality ohmic contacts to microstructures on each end, and substantial current could be passed through them. FIG. 22 shows the combined current-voltage characteristic of the six CNTs shown in FIG. 20. These results confirmed that the interface between a CNT and nickel catalyst forms an ohmic contact, as does the CNT p-type silicon boundary. Immediately following synthesis, the CNTs were subjected to various pressures of dry N2. When driven at only 1V, the resistance of the CNTs was observed to increase 13% as the pressure was decreased from 1 atm to 470 mTorr. Though N2 is a nonpolar molecule, it has been shown to adsorb (weakly) inside nanotubes. Therefore, the resultant self-assembled CNTs could be utilized directly as a pressure sensor. The average resistance of the CNTs was 40 k-ohm as metallic CNTs were the result of the synthesis process.

Figure 23:
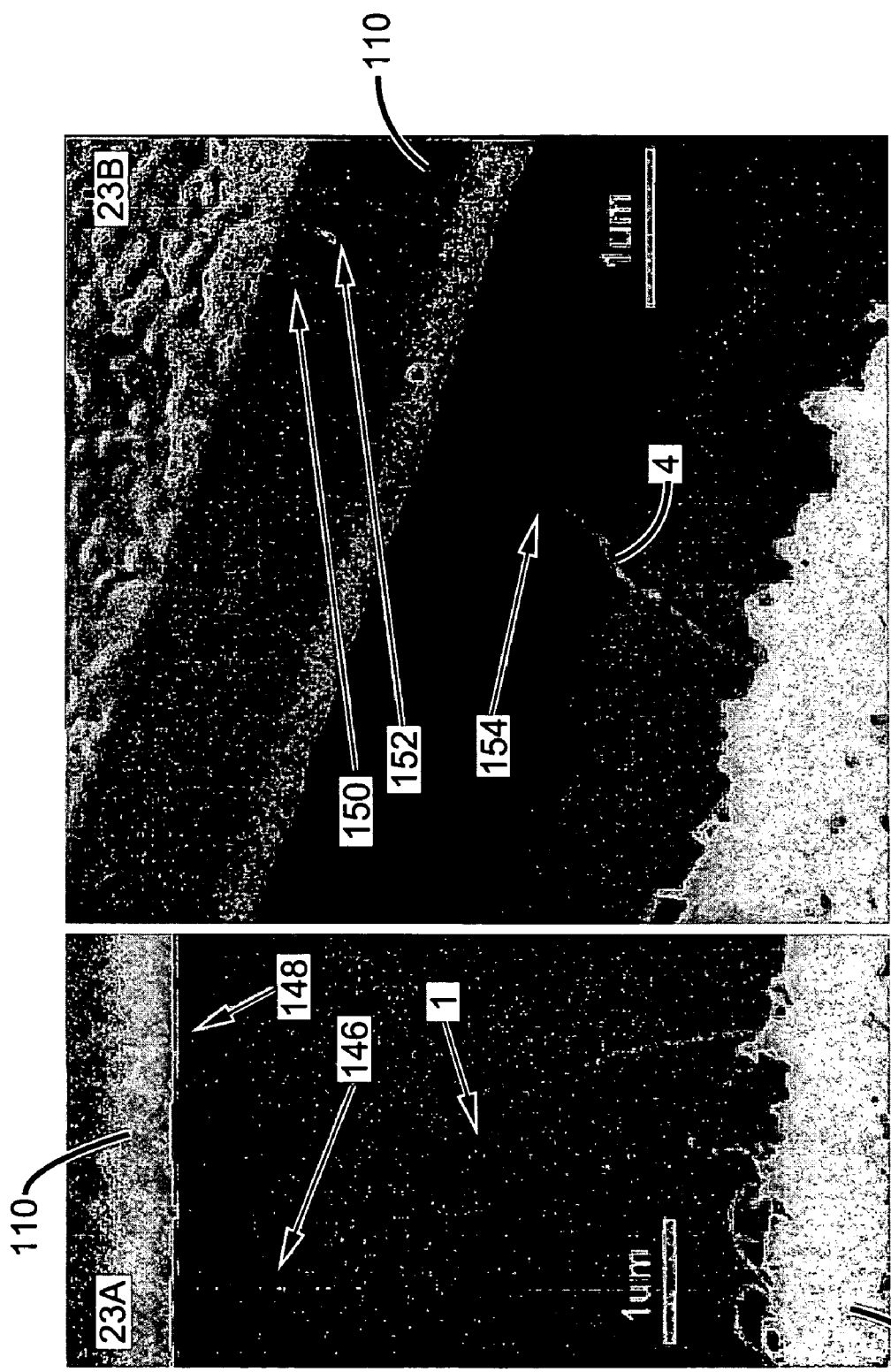

Referring to FIGS. 23A-B, in order to examine the mechanical contacts, the CNTs were then fractured by moving one of the microstructures. FIG. 23A shows SEM images of the fractured CNT 1 (shown in FIG. 20 and FIG. 21). At the left, CNT 1 separated at the interface with the microstructure wall 110. The end 146 of the CNT is shown in FIG. 23 and the prior location of the contact is shown at 148. In FIG. 23B, CNT 4 (shown in FIG. 19) fractured away from the interface. The location of the contact with the microstructure 110 is shown at 150 the location of the fracture is shown at 152 and the end of the CNT 4 is shown at 154.

Of the three CNTs where fracture location could be determined, two were observed to fracture away from the wall contact region, and one appears to have separated from the wall at the CNT-Si interface. Base growth is predominant in the synthesis method used, so it is presumed that the fullerene-like CNT tip breaks down at the Si surface and forms covalent bonds with available Si atoms. These bonds are seen to often be stronger than the CNT itself, making the synthesis method applicable to future high-force MEMS devices.

Note also that the self-assembly process of the present invention allows for the evaluation of the electric properties of the nanowires directly as opposed to other methods that require fluidic assembly and post-assembly contact depositions.

Referring now to FIG. 24, the proposed NEMS synthesis, assembly and integration will combine nanostructures, microstructures and microelectronics on the same chip. As such, the manufacturing cost is reduced as compared with using commercially available foundry services externally.

FIG. 24 illustrates the simplified cross sectional view of a combined CMOS+MEMS+nanostructures process 200. The fabrication process starts with the finished CMOS wafer before dicing. One mask is used to define the MEMS bridge 206 between Al interconnects 208 by etching through the passivation oxide layer 210 and into silicon substrate 202. A cavity 204 may be formed under bridge 206 to further thermally and electrically isolate the bridge from other microelectronics. Anisotropic etching (EDP-ethylenediamine-pyrocatechol or TMAH-tetramethylammonium hydroxide) or isotropic dry etching chemistry (such as xenon difluoride) can be used to release the p+ polysilicon or single crystal silicon bridge 206. Nanostructures 212 are then synthesized on the bridge as shown and described in FIGS. 2A-2G. This process can be conducted massively and in parallel at the wafer-level.

The self-assembled nanostructures make possible many fundamental studies and practical applications. For example, fundamental electrical and thermal properties of nano-structures can be characterized by measuring the voltage-current responses of nanostructures. Furthermore, by replacing bias bridge 110 in FIG. 14 with an actuator, one may connect the self-assembled nanowires/nanotube to a heactuator as shown in FIG. 15. Mechanical properties, such as Young's modulus, fracture toughness of the nano-structures can be detected by using the MEMS actuator to pull and actuate the nanostructures and record the mechanical behavior; building up a nano material testing environment by using MEMS heactuator as the force source.

FIGS. 25A-C illustrate a hierarchical assembly of ultra dense nanowires and nanotubes with built-in nano-level interconnections for selective and localized functionalization and CMOS system integration to accomplish a fully integrated nano-sensing system. The CMOS-based architecture 220 has a unit base area of 10×10 mm2 to accommodate both sensing circuitry 222 and a plurality of sensing elements 224 for effecting unique identification of any of 255 different chemical or biological agents. As shown in FIG. 25B, each sensing element 224 is based on a microbridge 226 generally spanning 1×2 mm2, including a suspended MEMS resistive heater spanning over gap 232 over substrate 230 via two supporting anchors 228. An active sensing area measuring spanning roughly 1×1 mm2 may be located at the center of the bridge 226 via a large number, (e.g. more than 1000) nanosensors 228 made of nanowires or nanotubes of small diameter (e.g. less than 20 nm diameter).

The above described wafer-level, hierarchical assembly procedures of the present invention are insensitive to the CMOS circuitry by localized synthesis and selective functionalization after the microelectronic fabrication process is completed. This site-specific, direct assembly of ultra-dense nanosensors 228 process takes the advantages of both the "top-down" IC fabrication process and the "bottom-up" nanotechnology with built-in nano-level interconnection as well as fault and defect tolerance. Therefore, this hierarchical architecture is scalable to the whole wafer-level and could make immediate impact to military/commercial applications using CMOS foundry services.

For two terminal devices, a second nano-level interconnection can be achieved by creating a local electrical field using a second grounded MEMS structure 240 to guide the growth of nanowires/nanotubes to the second structure to complete the architecture, as illustrated in FIGS. 25B and 25C. In FIG. 25B, the second MEMS structure 240 is located directly above the bridge 226 to orient the nanosensors 228 vertically. In FIG. 25C, the second MEMS structure 256 is located laterally across from bridge 252 above substrate 254 to orient the a plurality of curved nanosensors 228 horizontally in a curvilinear path. The same principle can be used to generate local plasma by biasing a third MEMS structure/bridge (not shown) to generate locally strong microplasma for local and select functionalization of the individual basic sensing element.

In the area of sensing applications, the connected nanostructures can be the foundation for excellent sensing applications due to high surface area-to-volume ratio as well as special material properties. Furthermore, since nanostructure-based sensors have extremely small thermal mass and are suspended above the substrate, the power requirement to ramp their temperature by several hundred degrees is minimal.

Additionally, when biomaterials are attached to these nanostructures, the resistance is expected to change accordingly. Because the diameter of the nanostructures is comparable to the reacting enzymes and other bio-species, sensors based on nanowires/nanotubes are expected to have high signal-to-noise ratio that no other technologies can match.

Referring now to FIGS. 26A-27B, an important aspect of the present invention is the proper design of insulation materials to prevent the temperature rise in the microelectronics region of the chip. Temperature is one of the most important control parameters during the synthesis of nanowires/nanotubes. To characterize the heat transfer process with respect to the input electrical power, an electro-thermal model is highly beneficial. When a line-shape resistive heater is used, a one-dimensional model can approximate the 3-dimensional micro scale heat transfer process. A heat conduction shape factor can be used to account the heat transfer of the other two dimensions and the heat equation is derived based on the principle of conservation of energy.

Figure 26B:
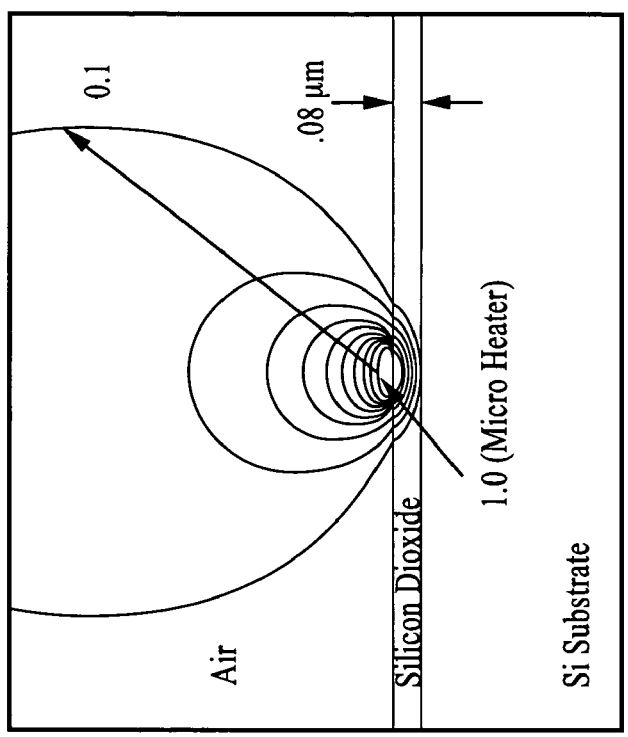
Figure 26A:
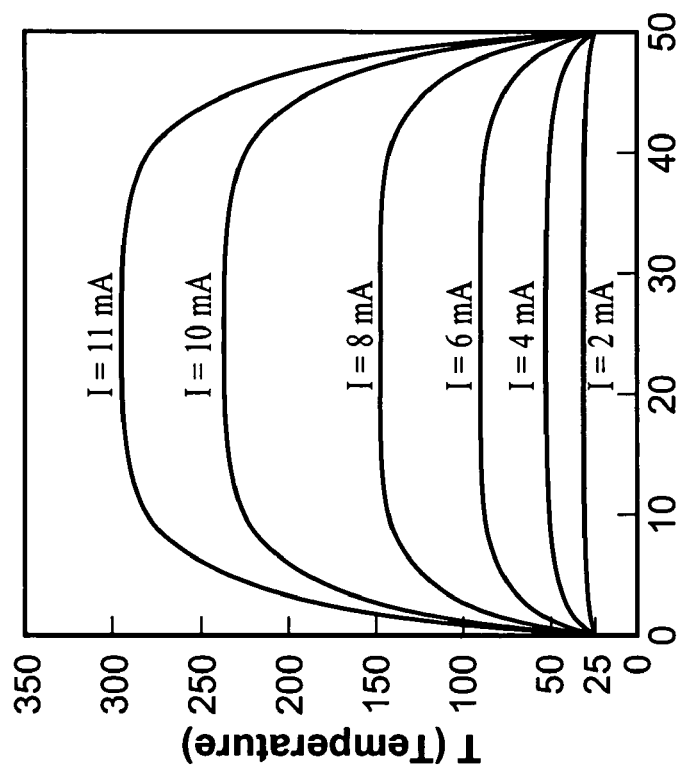

FIG. 26A shows the simulation result of a heavily phosphorus doped polysilicon heater with geometry of 50×2×0.5 mm³. It is found that with 11 mA of applied current, a temperature of about 300° C. can be generated. More importantly, the temperature profile is uniform at the central regions of the heater. The heat transfer process during the synthesis process can be very complicated.

To investigate the effects of localized heating, the worst case scenario may be simulated where the resistive heater is actually attached to the substrate, instead of having a suspension gap for heat insulation. FIG. 26B illustrates a simulation using silicon as the substrate material and a single SiO2 layer to represent the passivation layers, as illustrated in FIG. 24. FIG. 25B shows the simulation result of steady-state isotherms on the cross section area of the resistive heating element. It clearly demonstrates that the high temperature region is confined in a small area surrounding the heater. For example, even if the temperature on the center heater is 1000° C., the temperature quickly drops to 10%, or only 100° C. in a distance of less than 1 mm into the insulation layer. As such, the silicon substrate is maintained at room temperature during the process. Therefore, localized heating and synthesis can be achieved without affecting the microelectronics and the process is suitable for post-CMOS processing. The detailed heat transfer process depends heavily on the thermal insulation layers of the substrate and the thermal properties of surrounding environment.

Figure 27B:
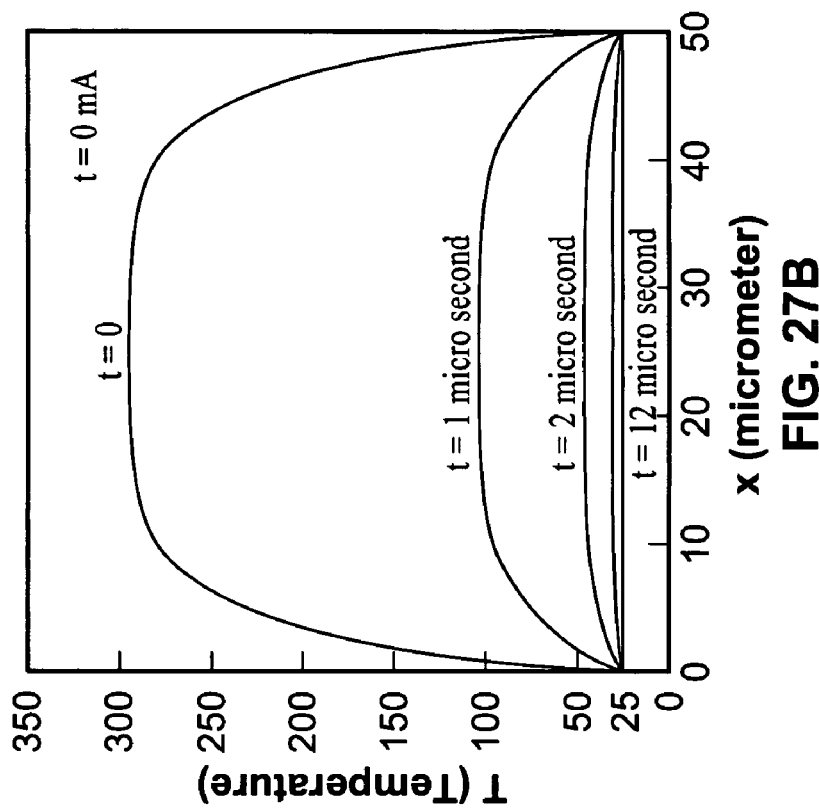
Figure 27A:
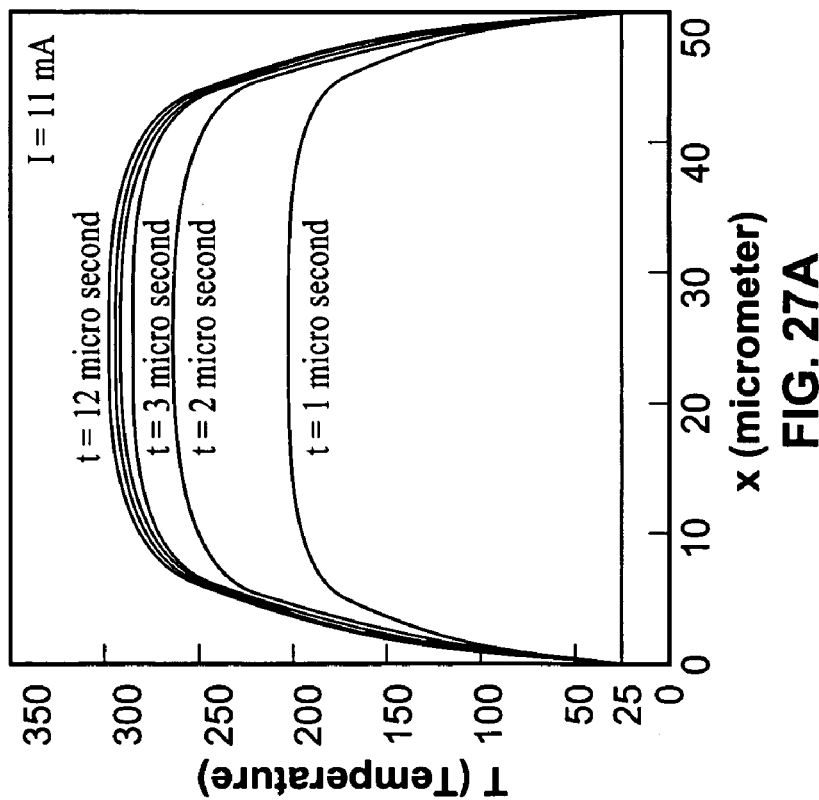
Figure 27D:
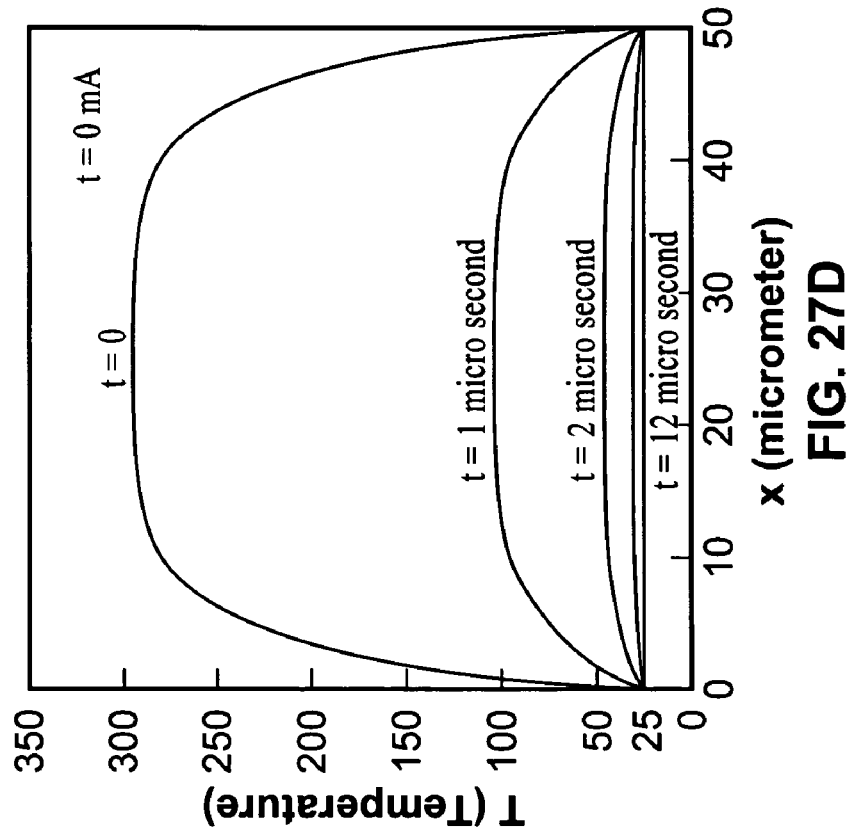
Figure 27C:
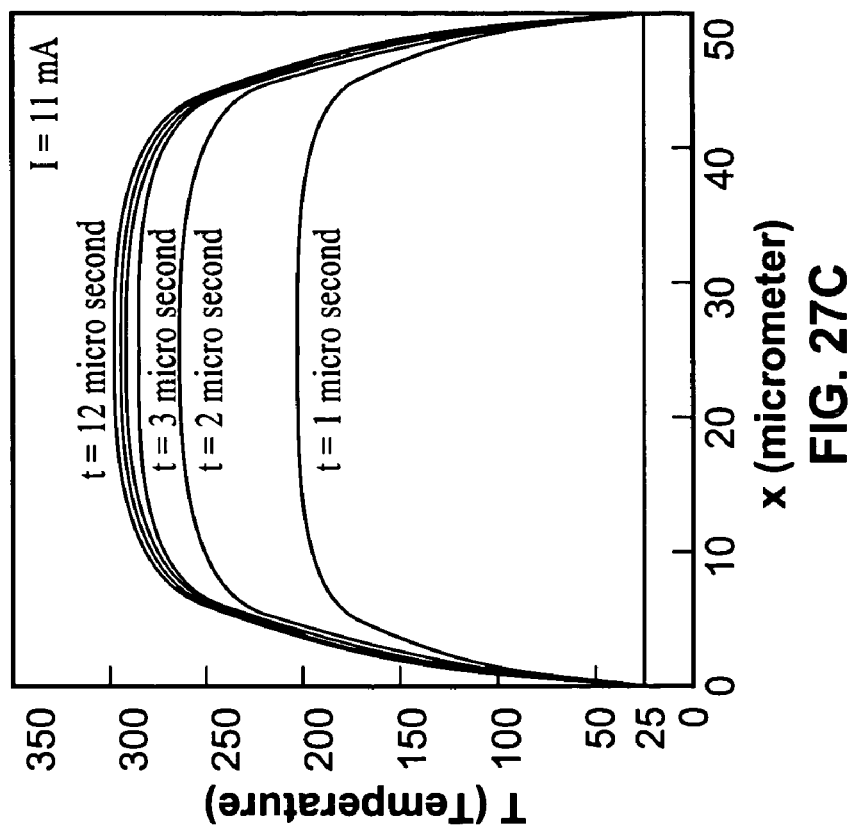

Transient analysis is useful for understanding and controlling the synthesis process of nanowires/nanotubes and provides insightful information for possible heating means such as using very short time of heating to grow nanostructures. Referring now to FIG. 27A, for a 50 mm long polysilicon microheater, the transient decay time is about 10 microseconds. Therefore, for input source of frequency less than 100 kHz, the microheater has no significant transient decay. For a target temperature of 300° C., FIGS. 27A and 27B show the transient heating and cooling processes, respectively. During the heating process, steady state is reached in about 10 microseconds. During the cooling process, the temperature drops to less than 50° C. in 2 microseconds. These initial simulations demonstrate that pulse heating for the nanostructure synthesis process is feasible. Furthermore, fine and fast temperature control can be achieved by using this localized heating method.

In summary, room-temperature synthesis of nanowires and nanotubes in direct contact with MEMS structures has been clearly demonstrated. The process yielded localized regions of silicon nanowires, 30 nm to 80 nm in diameter and up to 10 μm in length, and carbon nanotubes, 10 nm to 50 nm in diameter and up to 5 μm in length. Growth rates of up to 1 μm/min for silicon nanowires and up to 0.25 μm/min for carbon nanotubes were observed.

Furthermore, orientation control of the nanowires and nanotubes by application of an electric field has been clearly demonstrated. The inventive process described herein allows direct integration of nanostructures with larger-scale systems and permits the placement of these nanostructures at predetermined, specific locations along the surface of a larger-scale system using the concept of localized heating. This process, therefore, eliminates the need for additional assembly steps and provides a microelectronic compatible technique for the integration of nanotechnology.

As can be seen, therefore, the present invention provides for both localized growth of nanowires and nanotubes in a room-temperature environment, as well as local control of the orientation of the nanostructures through application of an electric field. Note that, by orienting the electric field, the nanostructures can be oriented in multiple directions. For example, in addition to synthesizing the nanostructures in-plane (e.g., flat), they can be grown vertically or in other directions by positioning the return path. Furthermore, the nanostructures can be grown in multiple directions at the same time by placing return path bridges in different locations. Note, however, that the nanostructures need not be grown from bridge to bridge. Alternatively, they could be grown from a bridge to one or more probes which could be individually biased or positioned. In either configuration, contacts are made during growth and electric field orientation, thus resulting in self-assembly of the nanostructures. It will also be appreciated that the nanostructures could be doped during growth, thus allowing for the fabrication of self-assembled p-n junctions or the like.

It should also be appreciated that various methods for localized heating are contemplated within the scope of the present invention. For example, instead of a DC bias as described herein, an AC magnetic field could be used in a heating mode. Another approach would be to shine a laser onto a structure for localized heating. Still another approach would be to initiate an exothermic chemical reaction. Radioactivity could also be used for localized heating.

The present invention is also suitable for fabrication of nanostructures using various materials other than those described above. For example, materials such as tin oxide, indium phosphide, gallium arsenide, zinc oxide, group III-IV, group II-V, intrinsic elements, and various other materials could be used as well. The resultant nanostructures are sensitive, and could be used to study characteristics of other structures.

It will be appreciated that the present invention is revolutionary in its ability to connect a nanostructure to a device by growing the nanostructure on the device itself; that is, the need for separate connection steps can be eliminated. The present invention provides for local control of orientation through local control of an applied electric field, resulting in self-assembly of nanowires and carbon nanotubes.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

| Device surface material | Device Type | L (µm) | W (µm) | I (mA) | V (volts) | |
|---|---|---|---|---|---|---|
| Polysilicon | Bridge | 100 | 5 | 5.5 | 4 | FIGS. 4A-C |
| Polysilicon | U-shaped | 100 | 2 | 0.39 | 8 | FIGS. 5A-B |
| SCS | U-shaped | 100 | 2 | 9.78 | 13 | FIG. 6 |

What is claimed is:

1. A method for synthesizing a nanostructure, comprising:
   providing a resistive microstructure;
   passing a current through the microstructure to cause it to resistively heat in a room-temperature environment; and
   controlling the temperature of a location on the microstructure by controlling the current and voltage applied to the microstructure;
   wherein the controlled location on the microstructure provides the energy necessary to instigate and sustain synthesis of the nanostructure of interest;
   wherein providing a resistive microstructure comprises suspending a microstructure above a substrate; and
   wherein said microstructure is insulated from the substrate.

2. A method as recited in claim 1, wherein suspending a microstructure comprises etching a microstructure from a multilayer wafer.

3. A method as recited in claim 1, further comprising coating the microstructure with a catalyst prior to heating the microstructure.

4. A method as recited in claim 1, further comprising subjecting the microstructure to a treatment gas.

5. A method as recited in claim 4, wherein the treatment gas comprises one or more of the following: acetylene, silane, silicon tetrachloride, or methane.

6. A method as recited in claim 4, further comprising subjecting the treatment gas to the microstructure under vacuum.

7. A method as recited in claim 3, wherein the catalyst comprises a layer comprising one or more of the following elements: nickel, iron, titanium, zinc, tin, gold, and palladium.

8. A method as recited in claim 1, further comprising:
   applying an electric field to the region of nanostructure synthesis;
   wherein nanostructure growth follows the direction of the electric field lines.

9. A method as recited in claim 8, further comprising:
   providing a secondary structure in proximity of the resistive microstructure;
   wherein the nanostructure is synthesized from the resistive microstructure to the secondary structure which the nanostructure contacts and bonds thereto.

10. A method of integrating a nanostructure with a wafer comprising at least one microelectronic device, comprising:
    establishing a resistive microstructure on the wafer;
    said resistive microstructure being thermally insulated from the microelectronic device;
    supplying current to the resistive microstructure to generate localized heat at a location on the microstructure while maintaining the microelectronic device at room temperature; and
    synthesizing one or more nanostructures at the location on the microstructure as a result of the localized heat at the location.

11. A method as recited in claim 10, wherein establishing the resistive microstructure comprises:
    etching a resistive microbridge into the wafer; and
    coating the microbridge with a catalyst layer.

12. A method as recited in claim 11, further comprising:
    etching a cavity under the microbridge to insulate the microbridge from the wafer.

13. A method as recited in claim 11, further comprising:
    subjecting the microstructure to a treatment gas;
    said treatment gas facilitating growth of said nanostructures.

* * * * *